(12) United States Patent
Hsu et al.

(10) Patent No.: US 12,027,644 B2
(45) Date of Patent: Jul. 2, 2024

(54) SEMICONDUCTOR DEVICE

(71) Applicant: IREACH CORPORATION, Hsinchu (TW)

(72) Inventors: Tzu-Chieh Hsu, Hsinchu (TW); Yi-Wen Huang, Hsinchu (TW); Shou-Lung Chen, Hsinchu (TW); Hsin-Kang Chen, Hsinchu (TW)

(73) Assignee: IREACH CORPORATION, Hsinchu (TW)

( * ) Notice: Subject to any disclaimer, the term of this patent is extended or adjusted under 35 U.S.C. 154(b) by 0 days.

(21) Appl. No.: 18/127,484

(22) Filed: Mar. 28, 2023

(65) Prior Publication Data

US 2023/0246125 A1 Aug. 3, 2023

Related U.S. Application Data

(63) Continuation of application No. 17/333,611, filed on May 28, 2021, now Pat. No. 11,699,774, which is a
(Continued)

(51) Int. Cl.
H01L 33/10 (2010.01)
H01L 33/20 (2010.01)
(Continued)

(52) U.S. Cl.
CPC ............ H01L 33/10 (2013.01); H01L 33/20 (2013.01); H01L 33/385 (2013.01); H01L 33/60 (2013.01);
(Continued)

(58) Field of Classification Search
CPC ....... H01L 33/10; H01L 33/20; H01L 33/385; H01L 33/38; H01L 33/60; H01L 33/62; H01S 5/0216; H01S 5/02; H01S 5/042; H01S 5/04254; H01S 5/04256; H01S 5/423; H01S 5/0217; H01S 5/04257; H01S 5/18305; H01S 5/183; H01S 5/18311; H01S 5/18322; H01S 5/18361; H01S 2301/176;
(Continued)

(56) References Cited

U.S. PATENT DOCUMENTS 6,658,041 B2   12/2003  Uebbing
6,692,979 B2   2/2004   Yeh et al.
(Continued)

FOREIGN PATENT DOCUMENTS

CN   101964499 A   2/2011
CN   103824923 A   5/2014
(Continued)

Primary Examiner — Nikolay K Yushin
(74) Attorney, Agent, or Firm — McClure, Qualey & Rodack, LLP

(57) ABSTRACT

A semiconductor device includes a substrate having a first side and a second side opposite to the first side; a first optical element at the first side of the substrate; and a semiconductor stack on the substrate. The semiconductor stack includes a first reflective structure; a second reflective structure; a cavity region between the first reflective structure and the second reflective structure and having a first surface and a second surface opposite to the first surface; and a confinement layer in one of the second reflective structure and the first reflective structure. The semiconductor device further includes a first electrode and a second electrode on the first surface.

12 Claims, 23 Drawing Sheets

Related U.S. Application Data continuation of application No. 16/709,369, filed on Dec. 10, 2019, now Pat. No. 11,024,768, which is a continuation of application No. 15/971,367, filed on May 4, 2018, now Pat. No. 10,535,799.

(60) Provisional application No. 62/503,528, filed on May 9, 2017.

(51) Int. Cl.
*H01L 33/38* (2010.01)
*H01L 33/60* (2010.01)
*H01L 33/62* (2010.01)
*H01S 5/02* (2006.01)
*H01S 5/04* (2006.01)
*H01S 5/042* (2006.01)
*H01S 5/42* (2006.01)
*H01S 5/183* (2006.01)

(52) U.S. Cl.
CPC ............ *H01L 33/62* (2013.01); *H01S 5/0216* (2013.01); *H01S 5/0425* (2013.01); *H01S 5/04254* (2019.08); *H01S 5/04256* (2019.08); *H01S 5/423* (2013.01); *H01S 5/0217* (2013.01); *H01S 5/04257* (2019.08); *H01S 5/18305* (2013.01); *H01S 5/18311* (2013.01); *H01S 2301/176* (2013.01)

(58) Field of Classification Search
CPC ......... H01S 2301/166; H01S 2301/163; H01S 5/0425; H01S 5/04; H01S 2301/17; H01S 2301/206; H01S 2301/16
See application file for complete search history.

(56) References Cited

U.S. PATENT DOCUMENTS

| | | |
|---|---|---|
| 6,819,701 B2 | 11/2004 | Henrichs |
| 6,954,479 B2 | 10/2005 | Albrecht et al. |
| 8,592,837 B2 | 11/2013 | Hodota et al. |
| 8,783,893 B1 | 7/2014 | Seurin |
| 8,912,564 B2 | 12/2014 | Chen et al. |
| 8,995,485 B2 | 3/2015 | Joseph et al. |
| 9,159,712 B2 | 10/2015 | Ootorii |
| 9,768,345 B2 | 9/2017 | Hu et al. |
| 9,819,144 B2 | 11/2017 | Lin et al. |
| 10,431,722 B2 | 10/2019 | Hayakawa et al. |
| 10,498,103 B2 | 12/2019 | Ootorii |
| 10,797,469 B2 | 10/2020 | Halbritter |
| 11,888,291 B2 | 1/2024 | Joseph |
| 2003/0032209 A1 | 2/2003 | Yeh et al. |
| 2011/0019709 A1 | 1/2011 | Masui et al. |
| 2012/0241721 A1 | 9/2012 | Hodota et al. |
| 2012/0327965 A1 | 12/2012 | Shinoda et al. |
| 2018/0047882 A1 | 2/2018 | Hayakawa et al. |

FOREIGN PATENT DOCUMENTS

| | | |
|---|---|---|
| CN | 106611934 A | 5/2017 |
| CN | 103178442 B | 2/2018 |
| TW | 201240249 A | 10/2012 |
| TW | 201530809 A | 8/2015 |

SEMICONDUCTOR DEVICE

CROSS REFERENCE TO RELATED APPLICATIONS

This application is a Continuation of co-pending application Ser. No. 17/333,611, filed on May 28, 2021, which is a Continuation of application Ser. No. 16/709,369, filed on Dec. 10, 2019, which is a Continuation of U.S. application Ser. No. 15/971,367, filed on May 4, 2018, which claims priority of U.S. Provisional Application No. 62/503,528 filed on May 9, 2017 under 35 U.S.C. § 119(e), the entire contents of all of which are hereby incorporated by reference.

TECHNICAL FIELD

The disclosure relates to a semiconductor device, and particularly to a semiconductor device including a cavity region.

BACKGROUND

A vertical cavity surface emitting laser (VCSEL) is a laser capable of emitting a light in a direction perpendicular to an active region. The VCSEL includes a structure having a pair of mirror stacks, and an active region formed between the pair of mirror stacks. A first electrode and a second electrode are formed above and below the pair of mirror stacks respectively. An electrical current is injected into the active region through the first electrode and the second electrode to generate the light in the active region, and the light is emitted out of the VCSEL structure.

SUMMARY

The present disclosure provides a semiconductor device. The semiconductor device includes a first semiconductor contact layer having a top side and a back side opposite the top side, and plural columnar semiconductor stack structures over the top side of the first semiconductor contact layer. Each of the columnar semiconductor stack structures includes a first reflective structure, a cavity region, a second reflective structure, a current confinement layer in the second reflective structure and having a conductive area and an insulating area surrounding the conductive area, and a second semiconductor contact layer. The semiconductor device further includes an insulating layer covering the columnar semiconductor stack structures and having openings formed through the insulating layer, a first electrode disposed over at least portion of the first semiconductor contact layer, a second electrode disposed over at least portion of the first semiconductor contact layer. Each of the openings is directly on the columnar semiconductor stack structures and at least one of the openings corresponds to at least one of the insulating areas. A width of the opening is equal to or smaller than a width of the insulating area.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF THE EMBODIMENTS

Figure 1:
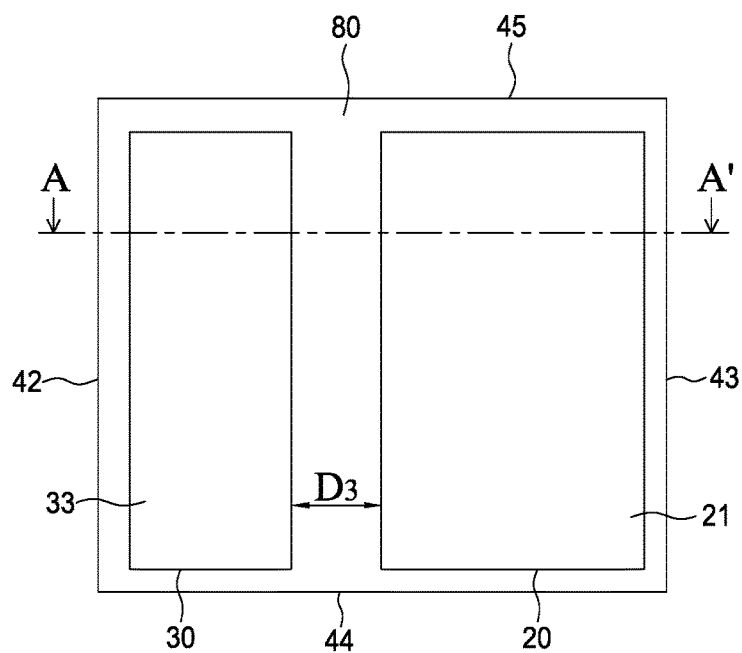
FIG. 1 is a schematic top view of a first embodiment of a semiconductor device.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present disclosure, if not specifically mention, the general expression of AlGaAs means $Al_{x1}Ga_{(1-x1)}As$, wherein $0 \leq x1 \leq 1$; the general expression of AlInP means $Al_{x2}In_{(1-x2)}P$, wherein $0 \leq x2 \leq 1$; the general expression of AlGaInP means $(Al_{y1}Ga_{(1-y1)})_{1-x3}In_{x3}P$, wherein $0 \leq x3 \leq 1$, $0 \leq y \leq 1$; the general expression of AlGaN means $Al_{x4}Ga_{(1-x4)}N$, wherein $0 \leq x4 \leq 1$; the general expression of AlAsSb means $AlAs_{(1-x5)}Sb_{x5}$, wherein $0 \leq x5 \leq 1$ and the general expression of InGaP means $In_{x6}Ga_{1-x6}P$, wherein $0 \le x6 \le 1$; the general expression of InGaAsP means $In_{x7}Ga_{1-x7}As_{1-y2}P_{y2}$, wherein $0 \le x7 \le 1$, $0 \le y2 \le 1$; the general expression of InGaAsN means $In_{x8}Ga_{1-x8}As_{1-y3}N_{y3}$, wherein $0 \le x8 \le 1$, $0 \le y3 \le 1$; the general expression of AlGaAsP means $Al_{x9}Ga_{1-x9}As_{1-y4}P_{y4}$, wherein $0 \le x9 \le 1$, $0 \le y4 \le 1$; the general expression of InGaAs means $In_{x10}Ga_{1-x10}As$, wherein $0 \le x10 \le 1$; the general expression of AlGaN means $Al_{x11}Ga_{1-x11}N$, wherein $0 \le x11 \le 1$; the general expression of InGaN means $In_{x12}Ga_{1-x12}N$, wherein $0 \le x12 \le 1$; the general expression of InAlGaN means $In_{x13}Al_{y5}Ga_{1-x-y}N$, wherein $0 \le x13 \le 1$, $0 \le y5 \le 1$. The content of the element can be adjusted for different purposes, such as, but not limited to, adjusting the energy gap or the peak wavelength of the light emitted from a semiconductor device when the semiconductor device includes a light-emitting device.

Figure 2:
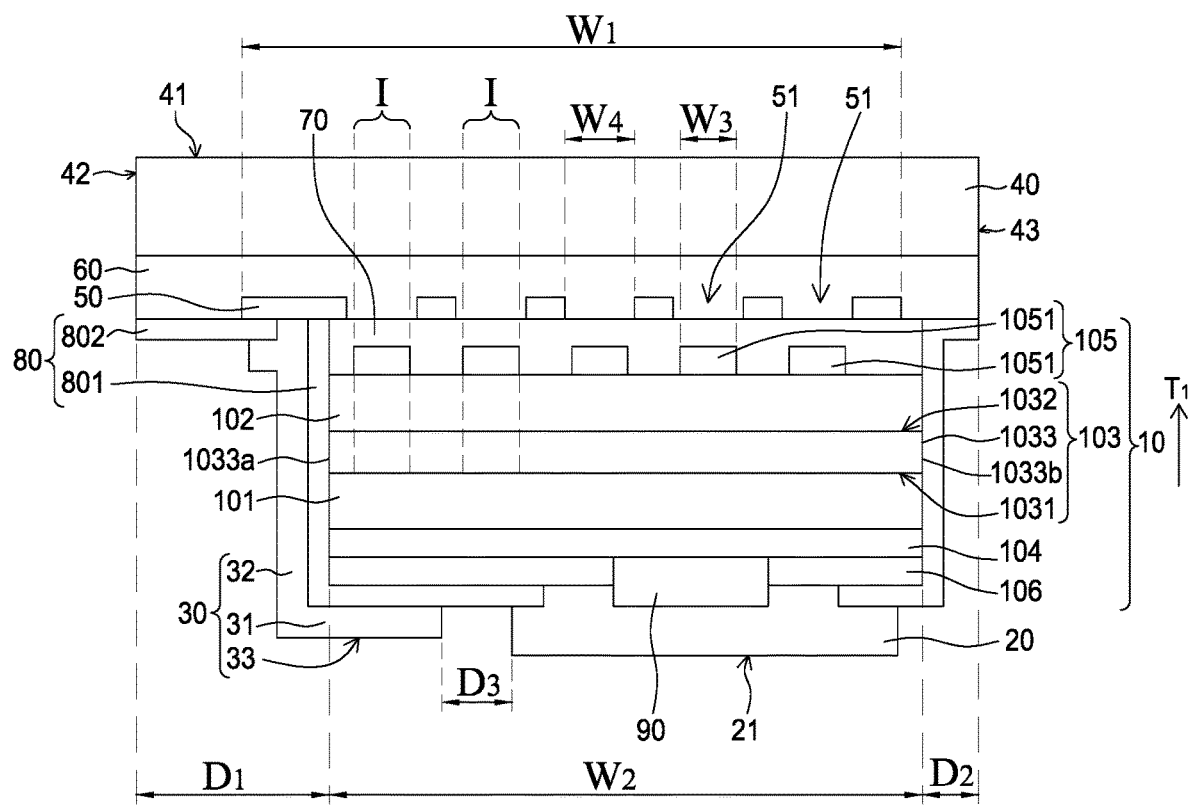
FIG. 2 is a schematic cross-sectional view of the semiconductor device along an A-A' line shown in FIG. 1.

FIG. 1 is a schematic top view of a first embodiment of a semiconductor device. FIG. 2 is a schematic cross-sectional view of the semiconductor device along an A-A' line shown in FIG. 1. The semiconductor device includes a semiconductor stack 10, a first electrode 20 electrically connected to the semiconductor stack 10, and a second electrode 30 electrically connected to the semiconductor stack 10. The semiconductor stack 10 includes a first reflective structure 101, a second reflective structure 102 and a cavity region 103 between the first reflective structure 101 and the second reflective structure 102. The first electrode 20 is electrically connected to the first reflective structure 101. The second electrode 30 is electrically connected to the second reflective structure 102. In the present embodiment, the first reflective structure 101 includes an n-type DBR, and the second reflective structure 102 includes a p-type DBR. In one embodiment, the first reflective structure 101 includes a p-type DBR, and the second reflective structure 102 includes an n-type DBR. The cavity region 103 is capable of emitting radiation. Preferably, the radiation is coherent. Preferably, the radiation has a far-field angle of less than 50 degrees, and more preferably, less than 40 degrees. The cavity region 103 includes an active region (not shown) including a multi-quantum well (MQW) structure. The far-field angle of the present disclosure is determined as the divergent angle at full width at half maximum intensity to specify the beam divergence.

The cavity region 103 includes a first surface 1031, a second surface 1032 opposite to the first surface 1031, and a sidewall 1033 between the first surface 1031 and the second surface 1032. The first surface 1031 is closer to the first reflective structure 101 than to the second reflective structure 102. The sidewall 1033 of the cavity region 10 includes a first part 1033a and a second part 1033b opposite to the first part 1033a. The first part 1033a of the sidewall 1033 is closer to the second electrode 30 than to the first electrode 20. The second part 1033b of the sidewall 1033 is closer to the first electrode 20 than to the second electrode 30. The second electrode 30 includes a pad portion 31 and a side portion 32 extending from the pad portion 31 and covering the sidewall 1033 of the cavity region 103. Specifically, the first part 1033a of the sidewall 1033 is closer to the side portion 32 of the second electrode 30 than to the first electrode 20. Preferably, the side portion 32 covers the first part 1033a of the sidewall 1033. The pad portion 31 is on the first surface 1031 of the cavity region 103. The first electrode 20 and the pad portion 31 of the second electrode 30 are on the same side of the cavity region 103. Preferably the first electrode 20 is not overlapped with the second electrode 30 in a thickness direction (T1) of the cavity region 103. The thickness direction (T1) of the cavity region 103 is shown in FIG. 1.

In the present embodiment, the first electrode 20 and the pad portion 31 of the second electrode 30 are both on the first surface 1031. In other words, the first electrode 20 and the pad portion 31 of the second electrode 30 are both closer to the first surface 1031 of the cavity region 103 than to the second surface 1032 of the cavity region 103. Specifically, the first electrode 20 includes a first outer surface 21 substantially parallel to the first surface 1031 of the cavity region 103. The pad portion 31 of the second electrode 30 includes a second outer surface 33 substantially parallel to the first surface 1031 of the cavity region 103. The first outer surface 21 and the second outer surface 33 are on the same side of the cavity region 103. In the present embodiment, the first outer surface 21 and the second outer surface 33 are both on the first surface 1031. In other words, the first outer surface 21 and the second outer surface 33 are both closer to the first surface 1031 of the cavity region 103 than to the second surface 1032 of the cavity region 103. The second electrode 30 further covers the sidewall 1033 of the cavity region 103. A height difference between the first outer surface 21 and the second outer surface 33 is not more than 5 μm, and preferably, is not more than 3 μm.

Each of the first reflective structure 101 and the second reflective structure 102 includes multiple alternating first semiconductor layers (not shown) and second semiconductor layers (not shown). Each of the first semiconductor layers has a first refractive index. Each of the second semiconductor layers has a second refractive index lower than the first refractive index of each of the first semiconductor layers. The first semiconductor layers and the second semiconductor layers include Group III-V semiconductor material. Preferably, each of the first semiconductor layers has a first Al content, and each of the second semiconductor layers has a second Al content. The second Al content of each of the second semiconductor layers is different from the first Al content of each of the first semiconductor layers, and preferably, is greater than the first Al content of each of the first semiconductor layers. In one embodiment, the first reflective structure 101 includes a first group (not labeled) and a second group (not labeled) on the first group. The first group includes a dopant including a first doping concentration, and the second group includes a dopant including a second doping concentration. Preferably, the first doping concentration is different from the second doping concentration. In one embodiment, the first doping concentration is greater than the second doping concentration. Preferably, the ratio of the first doping concentration to the second doping concentration is between 1.1 and 3 both inclusive, and preferably, is between 1.1 and 1.5 both inclusive. In one embodiment, the second doping concentration is greater than the first doping concentration. Preferably, the ratio of the second doping concentration to the first doping concentration is between 1.1 and 3 both inclusive, and preferably, is between 1.1 and 1.5 both inclusive. In one embodiment, the dopant in the first group is the same as the dopant in the second group.

In the present embodiment, the first semiconductor layers includes $Al_nGa_{(1-n)}As$, the second semiconductor layers includes $Al_mGa_{(1-m)}As$, wherein n is different from m, and preferably, m>n. The content of Al and Ga can be adjusted for reflecting a predetermined wavelength range. Each of the first semiconductor layers has a thickness substantially equal to $\lambda/4n$ and each of the second semiconductor layers has a thickness substantially equal to $\lambda/4n$, wherein λ is peak wavelength of the radiation emitted from the cavity region 103, and n is the refractive index of the corresponding layer. The first reflective structure 101 has a reflectivity of over 99% at the peak wavelength. The second reflective structure 102 has a reflectivity of over 98% at the peak wavelength. Preferably, the reflectivity of the first reflective structure 101 is higher than that of the second reflective structure 102.

The pair number of the first semiconductor layers and the second semiconductor layers in the first reflective structure 101 is greater than the pair number of the first semiconductor layers and the second semiconductor layers in the second reflective structure 102, wherein a first semiconductor layer and an adjacent second semiconductor layer are considered as a pair. Preferably, the pair number of the first reflective structure 101 is greater than 15, and more preferably, greater than 30, and less than 80. The pair number of the second reflective structure 102 is not less than 15, and more preferably, not less than 20, and not more than 80.

Referring to FIGS. 1 and 2, in the present embodiment, the semiconductor device further includes a substrate 40 on the semiconductor stack 10. The radiation emitted from the cavity region 103 escapes to the outside of the semiconductor device from the substrate 40 in a direction from the first surface 1031 toward the second surface 1032 of the cavity region 103. The substrate 40 includes a top surface 41 including a first area. The first outer surface 21 of the first electrode 20 includes a second area not less than 10% of the first area, and preferably, is not more than 40% of the first area, and more preferably, is between 13% and 30% of the first area both inclusive. The second outer surface 33 of the second electrode 30 includes a third area not less than 10% of the first area, and preferably, is not more than 40% of the first area, and more preferably, is between 13% and 30% of the first area both inclusive. The first area, the second area and the third area are viewed from the top view of the semiconductor device.

Referring to FIG. 2, in the present embodiment, the semiconductor device further includes a first conductive layer 50 between the substrate 40 and the semiconductor stack 10, and a bonding layer 60 covering the first conductive layer 50 and between the substrate 40 and the semiconductor stack 10. In the present embodiment, the semiconductor device includes multiple holes 51 formed through the first conductive layer 50 and arranged in a one-dimensional or two-dimensional array. The bonding layer 60 surrounds the first conductive layer 50, and a part of the bonding layer 60 is in the multiple holes 51. The bonding layer 60 is for connecting the substrate 40 and the semiconductor stack 10 and is substantially transparent to the radiation emitted from the cavity region 103. In one embodiment, the semiconductor device includes one hole formed through the first conductive layer 50. The bonding layer 60 surrounds the first conductive layer 50, and a part of the bonding layer 60 is in the hole.

In the present embodiment, the first conductive layer 50 has a first width $W_1$ greater than a second width $W_2$ of the cavity region 103. Specifically, a part of the first conductive layer 50 is not covered by the cavity region 103 and is thus exposed. The second electrode 30 is in direct contact with the exposed part of the first conductive layer 50. Specifically, the side portion 32 of the second electrode 30 is in direct contact with the exposed part of the first conductive layer 50. The first conductive layer 50 has a thickness not less than 500 nm, and preferably, not more than 3000 nm, and more preferably, not more than 2000 nm. In the present embodiment, the first electrode 20 and the second electrode 30 are on the same side of the first conductive layer 50.

Referring to FIG. 1, in the present embodiment, the substrate 40 includes a first face 42, a second face 43 opposite to the first face 42, a third face 44 and a fourth face 45 between the first face 42 and the second face 43. The top surface 41 of the substrate 40 is between the first face 42, the second face 43, the third face 44, and the fourth face 45. The first face 42 includes a first edge (not labeled). The second face 43 includes a second edge (not labeled). The third face 44 includes a third edge (not labeled). The fourth face 45 includes a fourth edge (not labeled). In the present embodiment, the length of the first edge of the first face 42 is shorter than that of the third edge of the third face 44 or the fourth edge of the fourth face 45. The length of the second edge of the second face 43 is shorter than that of the third edge of the third face 44 or the fourth face 45. In another embodiment, the length of the second edge of the second face 43, the length of the first edge of the first face 42, the length of the first edge of the third face 44, and the length of the fourth edge of the fourth face 45 may be substantially the same.

Referring to FIG. 2, in a cross-sectional view of the semiconductor device, a first distance ($D_1$) between the first face 42 of the substrate 40 and the first part 1033a of the sidewall 1033 of the cavity region 103 is different from a second distance ($D_2$) between the second face 43 of the substrate 40 and the second part 1033b of the sidewall 1033 of the cavity region 103. Preferably, the first distance ($D_1$) is greater than the second distance ($D_2$). Preferably, the first distance ($D_1$) is greater than the second distance ($D_2$) by at least 15 μm, and preferably, not more than 50 μm. The first distance ($D_1$) is not less than 20 μm, and preferably, is not more than 60 μm. The second distance ($D_2$) is not less than 5 μm, and preferably, is not more than 40 μm.

Referring to FIG. 2, in the present embodiment, the semiconductor stack 10 further includes a first semiconductor contact layer 104 between the first electrode 20 and the first reflective structure 101 and includes a second semiconductor contact layer 105 between the second reflective structure 102 and the first conductive layer 50. In the present embodiment, the second semiconductor contact layer 105 includes multiple discrete contact regions 1051 arranged in a one-dimensional or two-dimensional array. Specifically, each of the contact regions 1051 is directly right under one of the holes 51 formed through the first conductive layer 50. Preferable, one-to-One correspondence is between the contact regions 1051 and the holes 51. In other words, the first conductive layer 50 is not overlapped with the contact regions 1051 in a thickness direction (T1) of the cavity region 103.

In the present embodiment, the second electrode 30 is overlapped with one or more of the contact regions 1051 in a thickness direction (T1) of the cavity region 103. Specifically, the pad portion 31 of the second electrode 30 is overlapped with one or more of the contact regions 1051 in a thickness direction (T1) of the cavity region 103. Each of the contact regions 1051 has a third width $W_3$. Each of the holes 51 formed through the first conductive layer 50 has a fourth width $W_4$. The third width $W_3$ of one of the contact regions 1051 is less than the fourth width $W_4$ of the corresponding hole 51. Specifically, the third width $W_3$ of one of the contact regions 1051 is less than the fourth width $W_4$ of the hole 51 directly above the corresponding contact region 1051. Preferably, the third width $W_3$ of each of the contact regions 1051 is less than the fourth width $W_4$ of the corresponding hole 51. As a result, the problem of the first conductive layer 50 blocking the radiation emitted from the cavity region 103 can be avoided or alleviated.

In the present embodiment, each of the holes 51 has a shape of circle from a top view of the holes 51. Each of the contact regions 1051 has a shape of circle from a top view of the contact regions 105. The fourth width $W_4$ of one of the holes 51 is the diameter of the circle. The third width $W_3$ of one of the contact regions 1051 is the diameter of the circle. The shapes of the holes 51 and the contact regions 1051 are not limited to the present embodiment. The shapes of the holes 51 and the shapes of contact regions 1051 can be of ellipse, rectangular, square, rhombus or any other suitable shape from a top view of the contact regions 105. The third width $W_3$ is, but not limited to, between 15 µm and 40 µm both inclusive. The fourth width $W_4$ is, but not limited to, between 20 µm and 50 µm both inclusive.

In one embodiment, when the semiconductor device includes one hole formed through the first conductive layer 50, the second semiconductor contact layer 105 is right under the hole. In other words, the first conductive layer 50 is not overlapped with the second semiconductor contact layer 105 in a thickness direction (T1) of the cavity region 103. The second semiconductor contact layer 105 has a third width, and the hole formed through the first conductive layer 50 has a fourth width. Preferably, the third width is less than the fourth width.

Referring to FIG. 2, in the present embodiment, the semiconductor stack 10 further includes an etching stop layer 106 between the second electrode 30 and the first semiconductor contact layer 104. The semiconductor device further includes a second conductive layer 70 between the second reflective structure 102 and the first conductive layer 50. The second conductive layer 70 covers and surrounds the contact regions 1051. The contact resistance between the contact regions 1051 and the second reflective structure 102 is relatively lower than the contact resistance between the second conductive layer 70 and the second reflective structure 102. In the present embodiment, the material of the second conductive layer 70 is different from that of the first conductive layer 50.

Referring to FIGS. 1 and 2, in the present embodiment, the semiconductor device further includes a first insulating layer 80 between the semiconductor stack 10 and the second electrode 30. Besides, the first insulating layer 80 is between the first electrode 20 and the semiconductor stack 10. The first insulating layer 80 is overlapped with the second reflective structure 102 and the first reflective structure 101 in a thickness direction (T1) of the cavity region 103 and covers the sidewall 1033 of the cavity region 103. In the present embodiment, the first insulating layer 80 covers a bottom surface of the etching stop layer 106, covers a sidewall of the etching stop layer 106, covers a sidewall of the first semiconductor contact layer 104, covers a sidewall of the first reflective structure 101, covers the sidewall 1033 of the cavity region 103, covers a sidewall of the second reflective structure 102, covers a sidewall of the second conductive layer 70, and is in direct contact with the exposed part of the first conductive layer 50. The second electrode 30 covers a part of the first insulating layer 80 such that the first insulating layer 80 is between the first surface 1031 of the cavity region 103 and the pad portion 31 of the second electrode 30 and is between the sidewall 1033 of the cavity region 103 and the side portion 32 of the second electrode 30. The first electrode 20 covers another part of the first insulating layer 80 such that the first insulating layer 80 is also between the first surface 1031 of the cavity region 103 and the first electrode 20.

Referring to FIG. 2, in the present embodiment, in a cross-sectional view of the semiconductor device, the first insulating layer 80 includes a first region 801 and a second region 802. The second electrode 30 is between the first region 801 and the second region 802. Specifically, the second region 802 is separated from the first region 801 by the side portion 32 of the second electrode 30. The first region 801 is between the semiconductor stack 10 and the side portion 32 of the second electrode 30. The second region 802 is in direct contact with the bonding layer 60. In the present embodiment, the second region 802 is in direct contact with both the bonding layer 60 and the first conductive layer 50. The first insulating layer 80 has a thickness not less than 500 nm, and preferably, not more than 3 µm.

Referring to FIGS. 1 and 2, in the present embodiment, the first electrode 20 is separated from the second electrode 30, and a part of the first insulating layer 80 underneath is exposed. A third distance $D_3$ between the first electrode 20 and the second electrode 30 is not less than 50 µm, and preferably, not more than 300 µm, and more preferably, is between 90 µm and 200 µm both inclusive. In other words, a third distance $D_3$ between the first electrode 20 and the pad portion 31 of the second electrode 30 is not less than 50 µm, and not more than 300 µm, and preferably, is between 90 m and 200 m both inclusive.

Referring to FIG. 2, the semiconductor device further includes a metal contact layer 90 between the first electrode 20 and the first reflective structure 101. In the present embodiment, the metal contact layer 90 penetrates through the etching stop layer 106 and is thus in direct contact with the first semiconductor contact layer 104. In other words, the etching stop layer 106 surrounds the metal contact layer 90. In the present embodiment, the metal contact layer 90 is not overlapped with the second electrode 30 in a thickness direction (T1) of the cavity region 103. Specifically, the metal contact layer 90 is not overlapped with the pad portion 31 of the second electrode 30 in a thickness direction (T1) of the cavity region 103. Preferably, the metal contact layer 90 has a maximum width less than the maximum width of the first electrode 20. The maximum width of the metal contact layer 90 and the maximum width of the first electrode 20 are measured in a direction substantially perpendicular to the thickness direction (T1) of the cavity region 103.

When a current flows into the cavity region 103 through the first electrode 20 and the second electrode 30, because the contact resistance between the second semiconductor contact layer 105 and the second conductive layer 70 is relatively lower than the contact resistance between the second conductive layer 70 and the second reflective structure 102, the current mostly flows from the second conductive layer 70 toward the contact regions 1051 of the second semiconductor contact layer 105, and then into the cavity region 103 mainly through the contact regions 1051 of the second semiconductor contact layer 105. In other words, the current density of the portion of the second reflective structure 102 directly under the contact regions 1051 is much higher than the current density of the portion of the second reflective structure 102 without being covered by the contact regions 1051. In the present embodiment, the portions of the cavity region 103 directly under the contact regions 1051 function as main radiation emitting regions I, and the radiation emitted from the main radiation emitting regions I escapes to the outside of the semiconductor device from the substrate 40 through the holes 51 formed in the first conductive layer 50.

In the present embodiment, the semiconductor device has a forward voltage $V_f$, a lasing threshold current $I_{th}$, and a saturation current $I_{sat}$. The forward voltage $V_f$ is at which the semiconductor device starts to conduct a significant forward current. The lasing threshold current $I_{th}$ is the minimum current at which the radiation emitting from the radiation emitting region I of semiconductor device is dominated by stimulated emission rather than by spontaneous emission, and therefore the radiation becomes coherent. The saturation current $I_{sat}$ is a current at which the radiation output is no longer increased with increasing forward current. The radiation emitted from the main radiation emitting regions I of the semiconductor device of the present disclosure is an incoherent radiation at an operating voltage $V_{op}$ greater than a forward voltage $V_f$ of the semiconductor device and at a forward current less than the lasing threshold current $I_{th}$. The radiation emitted from the main radiation emitting regions I of the semiconductor device of the present disclosure is a coherent radiation at a forward current greater than the lasing threshold current $I_{th}$.

Figure 3A:
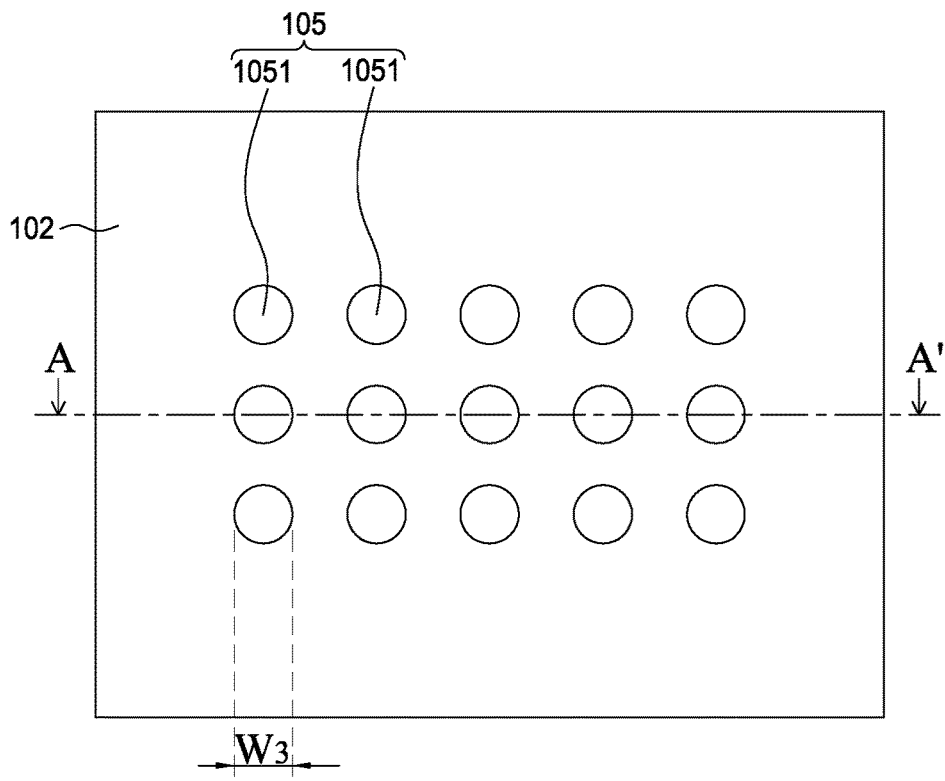
FIG. 3A through FIG. 3F demonstrate the method for manufacturing the semiconductor device shown in FIG. 1 and FIG. 2.
Figure 3B:
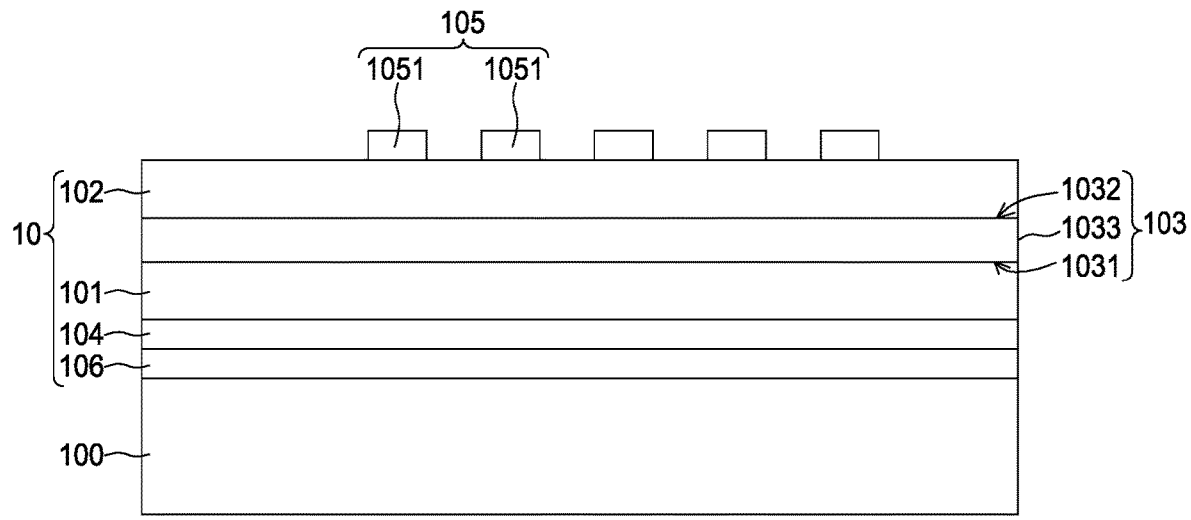

FIG. 3A through FIG. 3F demonstrate the method for manufacturing the semiconductor device shown in FIG. 1 and FIG. 2. FIG. 3A is a schematic top view after forming the contact regions 1051. FIG. 3B is a schematic cross-sectional view along an A-A' line shown in FIG. 3A. Referring to FIG. 3A and FIG. 3B, the method for making the semiconductor device as shown in FIGS. 1 and 2 includes the steps of providing a growth substrate 100; forming a semiconductor stack 10 on the growth substrate 100 by epitaxial growth, wherein the semiconductor stack 10 sequentially includes an etching stop layer 106, a first semiconductor contact layer 104, a first reflective structure 101, a cavity region 103, a second reflective structure 102 and a semiconductor layer (not shown); and patterning the semiconductor layer to form the second semiconductor contact layer 105 including the multiple contact regions 1051.

Figure 3C:
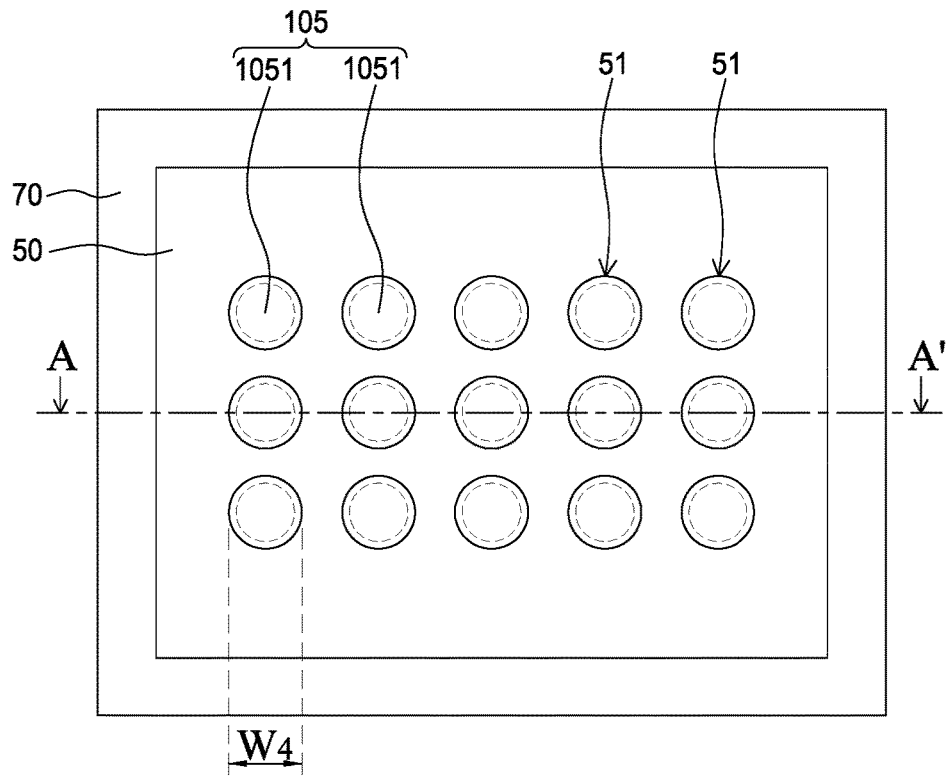
Figure 3D:
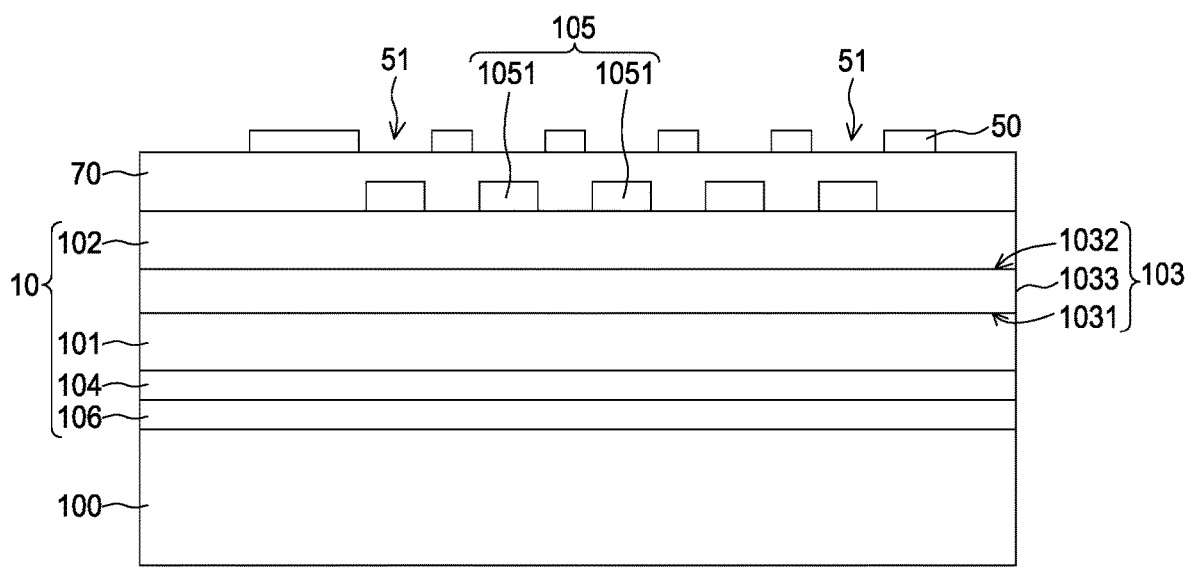

FIG. 3C is a schematic top view after forming the first conductive layer 50. FIG. 3D is a schematic cross-sectional view along an A-A' line shown in FIG. 3C. Referring to FIG. 3C and FIG. 3D, the method for making the semiconductor device further includes the steps of forming a second conductive layer 70 on the semiconductor stack 10 and covering the multiple contact regions 1051; forming a current-conducting layer (not shown) on the second conductive layer 70; and patterning the current-conducting layer by a lithographic mask to form an first conductive layer 50. After patterning the current-conducting layer, the semiconductor device includes multiple holes 51 formed through the first conductive layer 50. The position of the multiple holes 51 corresponds to the position of the contact regions 1051. In other words, the first conductive layer 50 is not overlapped with the contact regions 1051 in a thickness direction (T1) of the cavity region 103, and the holes 51 expose the underlying second conductive layer 70.

Figure 3E:
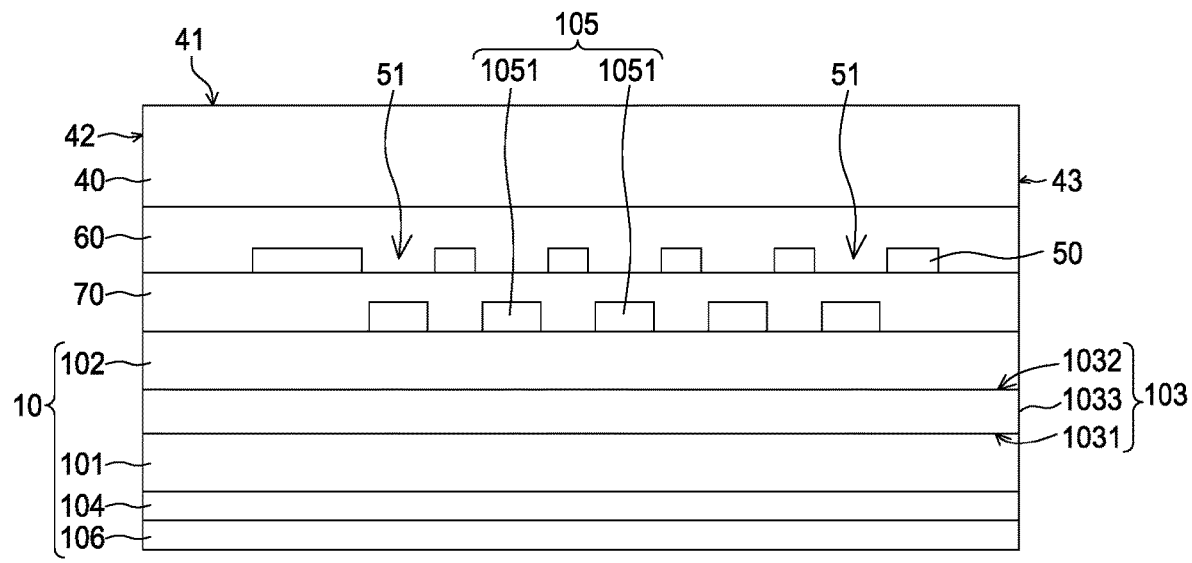

FIG. 3E is a schematic cross-sectional view after connecting to a substrate 40. Referring to FIG. 3E, the method for making the semiconductor device further includes the steps of providing a substrate 40; connecting the substrate 40 and the structure shown in FIG. 3D by a bonding layer 60; and removing the growth substrate 100 by any suitable method. A part of the bonding layer 60 is in the multiple holes 51 formed through the first conductive layer 50

Figure 3F:
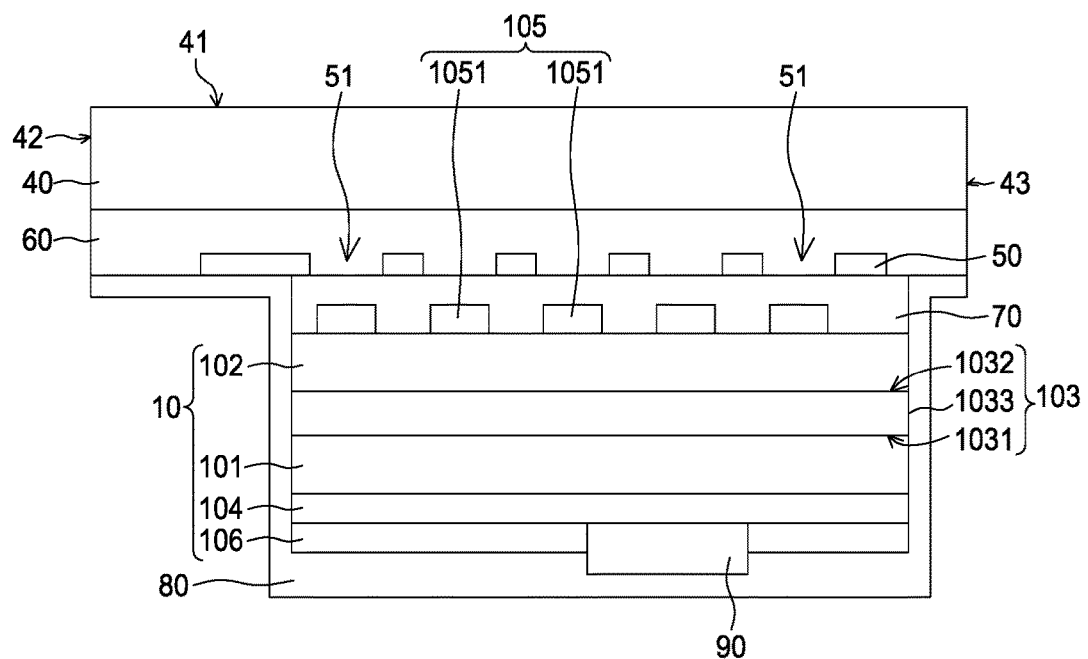

FIG. 3F is a schematic cross-sectional view after forming a first insulating layer 80. Referring to FIG. 3F, the method for making the semiconductor device further includes the steps of removing a periphery part of the semiconductor stack 10 and a periphery part of the second conductive layer 70 by any suitable method such as ICP or wet etching so as to expose a part of the first conductive layer 50 and a part of the bonding layer 60; removing a part of the etching stop layer 106 to expose a part of the first semiconductor contact layer 104; forming a metal contact layer 90 including alloy such as GeAuNi to directly contact the exposed part of the first semiconductor contact layer 104; forming a first insulating layer 80 on a surface of the etching stop layer 106 opposite to the substrate 40, covering a sidewall of the semiconductor stack 10, covering a sidewall of the second conductive layer 70, and in direct contact with the exposed part of the first conductive layer 50.

The method for making the semiconductor device further includes steps of removing a part of the first insulating layer 80 and forming a first electrode 20 and a second electrode 30 to finish the semiconductor device as shown in FIG. 2.

As shown in FIG. 2, a part of the first insulating layer 80 on the first conductive layer 50 is removed to form a ditch (not labeled) for exposing a part of the first conductive layer 50, and a part of the first insulating layer 80 on the first semiconductor contact layer 104 is removed to expose a part of the etching stop layer 106 and a part of the metal contact layer 90 at the same time. In another embodiment, the first insulating layer 80 can be removed to expose the metal contact layer 90 without exposing the etching layer 106. The ditch (not labeled) divides the first insulating layer 80 into a first region 801 and a second region 802 from a cross-sectional view of the unfinished semiconductor device. The first region 801 covers the sidewall of the semiconductor stack 10. [00059]. The first electrode 20 is in direct contact with the exposed part of the metal contact layer 90, and preferably, is in direct contact with the exposed part of the metal contact layer 90, the exposed part of the etching stop layer 106 and a part of the first insulating layer 80 at the same time. The second electrode 30 is separated from the first electrode 20 and is on the first insulating layer 80. Specifically, the second electrode 30 covers the first region 801. A part of side portion 32 of the second electrode 30 is in the ditch to be in direct contact with the exposed part of the electrode layer 50.

Figure 4A:
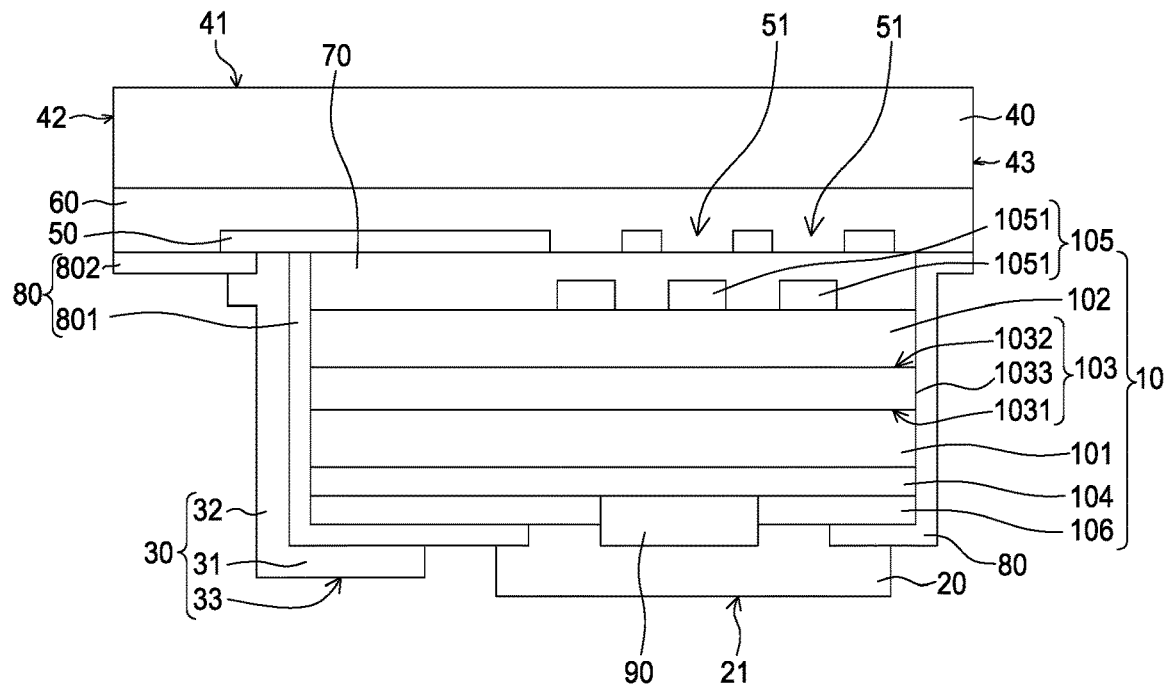
FIG. 4A is a schematic cross-sectional view of a second embodiment of the semiconductor device.
Figure 4B:
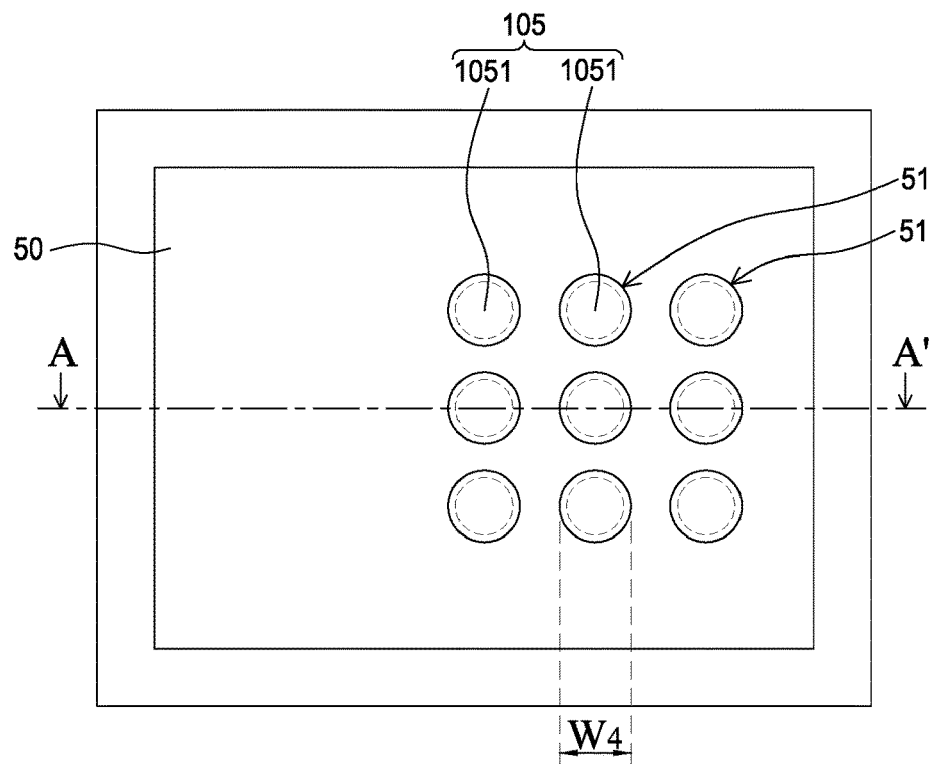
FIG. 4B is a schematic top view after forming the first conductive layer.

FIG. 4A is a schematic cross-sectional view of a second embodiment of the semiconductor device. The semiconductor device in accordance with the second embodiment of the present disclosure includes substantially the same structure as that of the first embodiment, and the method of making the semiconductor device in accordance with the second embodiment of the present disclosure includes substantially the same steps as that of the first embodiment. Similar to FIG. 3C, FIG. 4B is a schematic top view after forming the first conductive layer 50. The difference between the first embodiment and the second embodiment is that the second semiconductor contact layer 105 is not overlapped with the second electrode 30 in a thickness direction (T1) of the cavity region 103. In other words, the second semiconductor contact layer 105 is not overlapped with the pad portion 31 of the second electrode 30 in a thickness direction (T1) of the cavity region 103. Specifically, the holes 51 formed in the first conductive layer 50 are not overlapped with the pad portion 31 of the second electrode 30 in a thickness direction (T1) of the cavity region 103.

Figure 5:
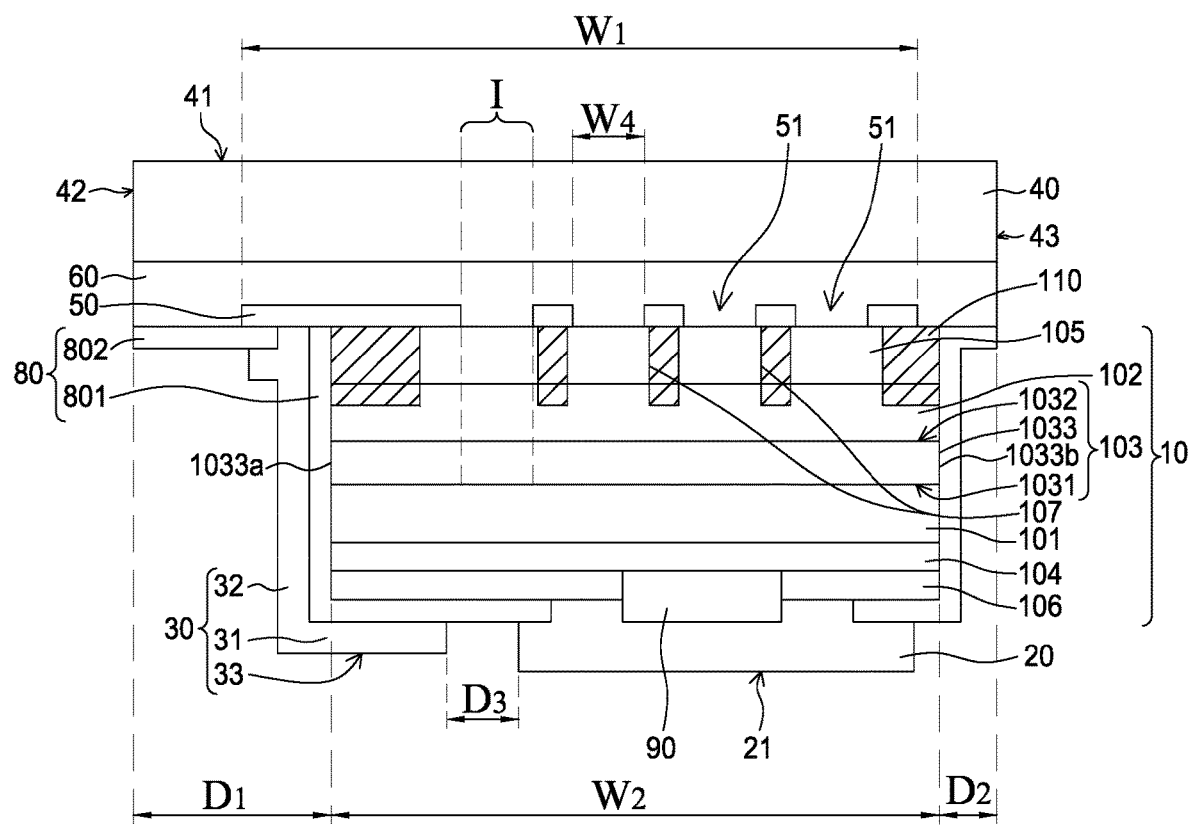
FIG. 5 is a schematic cross-sectional view of a third embodiment of the semiconductor device.
Figure 6A:
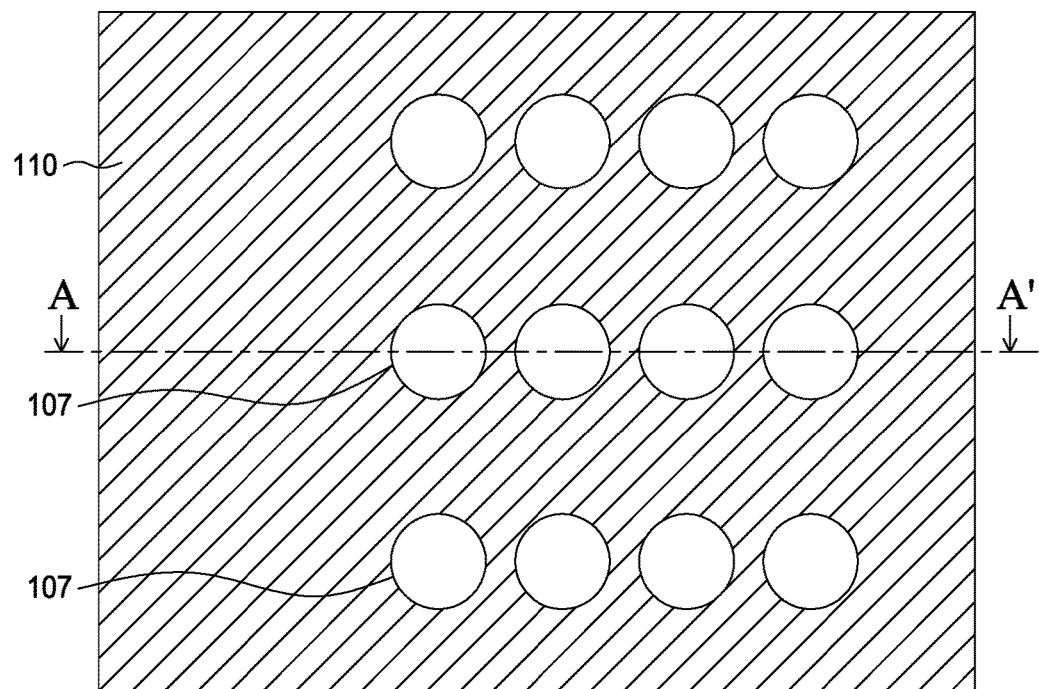
FIG. 6A through FIG. 6F demonstrate the method for manufacturing the semiconductor device shown in FIG. 5.

FIG. 5 is a schematic cross-sectional view of a third embodiment of the semiconductor device. The semiconductor device in accordance with the third embodiment of the present disclosure includes substantially the same structure as the first embodiment, and the difference is described below. In the present embodiment, the second semiconductor contact layer 105 does not include the multiple discrete contact regions 1051 in the first embodiment. The first conductive layer 50 is directly on the second semiconductor contact layer 105. The semiconductor device of the present embodiment is devoid of the second conductive layer 70, which is interposed between the second reflective structure 102 and the bonding layer 60 as described in the first embodiment. The semiconductor device further includes an insulating region 110 in the semiconductor stack 10 to define one or more conductive regions 107 in the semiconductor stack 10. The insulating region 110 includes ions such as Ar ions, He ions, or hydrogen ions for reducing the electrical conductivity. Referring to FIG. 6A, the insulating region 110 surrounds the multiple conductive regions 107. In the present embodiment, the insulating region 110 is above the first semiconductor contact layer 104. More preferably, the insulating region 110 is above the cavity region 103. Each of the conductive regions 107 includes the part of the second semiconductor contact layer 105 and the part of the second reflective structure 102 without including the ions for reducing the electrical conductivity. Each of the conductive regions 107 is directly under one of the multiple holes 51.

In the present embodiment, the insulating region 110 is in the second semiconductor contact layer 105 and in the second reflective structure 102. In another embodiment, the insulating region 110 is only in the second reflective structure 102. Specifically, the insulating region 110 is not directly under the holes 51 formed through the first conductive layer 50. In other words, the insulating region 110 is overlapped with the first conductive layer 50 in the thickness direction (T1) of the cavity region 103. However, the insulating region 110 is not overlapped with the holes 51 formed through the first conductive layer 50 in the thickness direction (T1) of the cavity region 103.

The pattern of the insulating region 110 is substantially the same as the pattern of the first conductive layer 50. In other words, the conductive regions 107, which are surrounded by the insulating region 110 and are separated from each other, are arranged in a one-dimensional or two-dimensional array. Preferably, the arrangement of the conductive regions 107 is the same as the arrangement of the holes 51 formed through the first conductive layer 50. Besides, each of the conductive regions 107 is directly under one of the holes 51 respectively. In the present embodiment, the shape of the conductive regions 107 from a top view of the conductive regions 107 can be ellipse, rectangular, square, rhombus or any other shape. Each of the conductive regions 107 has an electrical conductivity higher than that of the insulating region 110. Preferably, the electrical conductivity of each of the conductive regions 107 is higher than the electrical conductivity of the insulating region 110 by at least 3 orders of magnitude, and preferably, by at least 5 orders of magnitude.

The holes 51 formed through the first conductive layer 50 expose a part of the underlying second semiconductor contact layer 105. In the present embodiment, when a current flows into the cavity region 103 through the first electrode 20 and the second electrode 30, because the electrical conductivity of the conductive regions 107 under the holes 51 is higher than the electrical conductivity of the insulating region 110, the current mostly flows into the cavity region 103 through the conductive regions 107 directly under the holes 51. In the present embodiment, the portions of the cavity region 103 directly under the holes 51 respectively function as main radiation emitting regions I, and the radiation emitted from the main radiation emitting regions I escapes to the outside of the semiconductor device from the substrate 40 through the holes 51 formed through the first conductive layer 50. In the present embodiment, in a cross-sectional view of the semiconductor device, the width of one of the conductive regions 107 is greater than the fourth width $W_4$ of the corresponding hole 51. Preferably, the width of each of the conductive regions 107 is greater than the fourth width $W_4$ of the corresponding hole 51. In other words, the first conductive layer 50 is overlapped with both the conductive regions 107 and the insulating region 110 in the thickness direction (T1) of the cavity region 103.

Figure 6B:
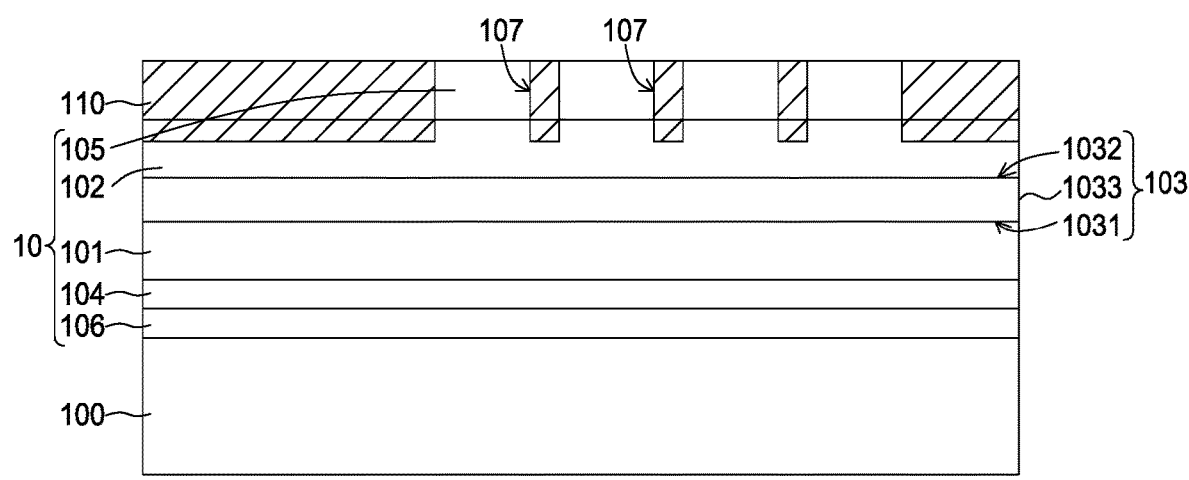

FIG. 6A through FIG. 6F demonstrate the method for manufacturing the semiconductor device shown in FIG. 5. FIG. 6A is a schematic top view after forming the insulating region 110. FIG. 6B is a schematic cross-sectional view along an A-A' line shown in FIG. 6A Referring to FIG. 6A and FIG. 6B, the method for making the semiconductor device as shown in FIG. 5 includes the steps of providing a growth substrate 100; forming a semiconductor stack 10 on the growth substrate 100 by epitaxial growth; and forming an insulating region 110 in a part of the semiconductor stack 10 by implanting ions such as Ar ions, He ions, or hydrogen ions into the part of the semiconductor stack 10 to reduce the electrical conductivity thereof while substantially without affecting the electrical conductivity of the other part of the semiconductor stack 10. In this embodiment, the ions are implanted into a part of the second semiconductor contact layer 105 and a part of the second reflective structure 102 to form the insulating region 110 and define the conductive regions 107 surrounded by the insulating region 110. More preferably, the ions are not implanted into the cavity region 103. In another embodiment, the ions are implanted only into a part of second reflective structure 102. The part of the second semiconductor contact layer 105 and the second reflective structure 102 without including the implanted ions are the conductive regions 107. In the present embodiment, the conductive regions 107 are arranged in a one-dimensional or two-dimensional array.

Figure 6C:
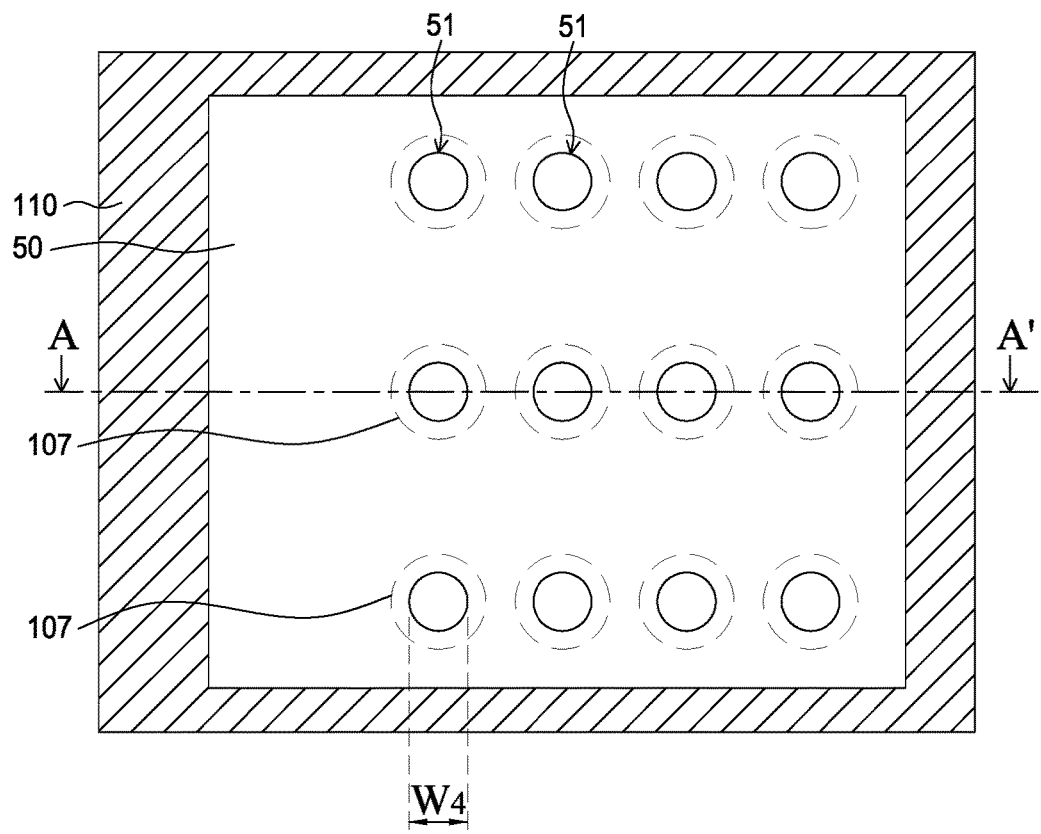
Figure 6D:
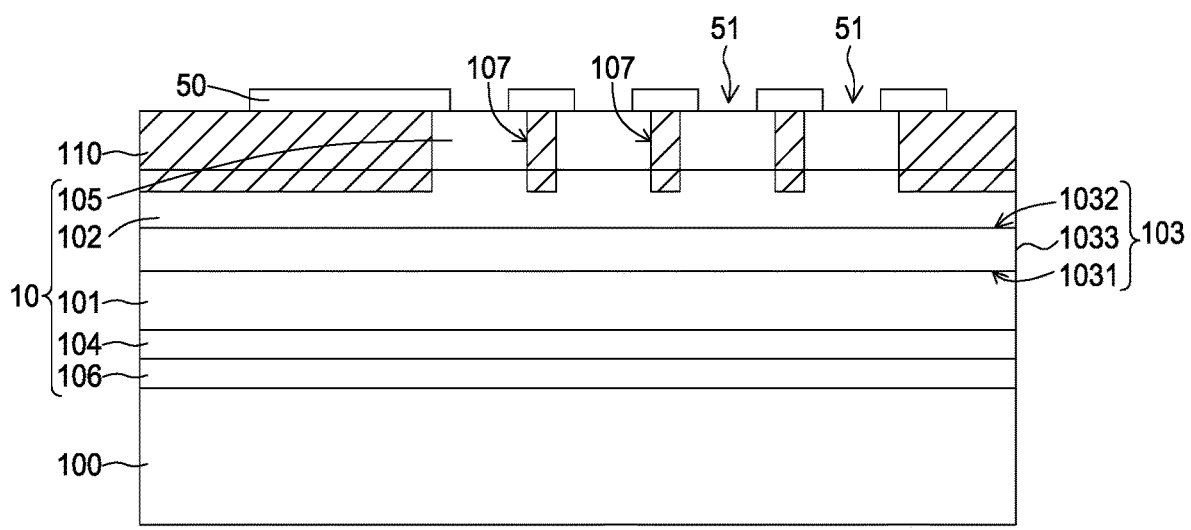

FIG. 6C is a schematic top view after forming the first conductive layer 50. FIG. 6D is a schematic cross-sectional view along an A-A' line shown in FIG. 6C. Referring to FIG. 6C and FIG. 6D, the method for making the semiconductor device as shown in FIG. 5 further includes steps of forming a current-conducting layer (not shown) on the semiconductor stack 10; and patterning the current-conducting layer by a lithographic mask to form an first conductive layer 50. After patterning the current-conducting layer, multiple holes 51 are formed through the first conductive layer 50 to expose a part of the underlying second semiconductor contact layer 105 without including the implanted ions. In other words, each of the conductive regions 107 is exposed from the corresponding hole 51. In the present embodiment, in a cross-sectional view of the semiconductor stack 10, the width of each of the conductive regions 107 is greater than the fourth width $W_4$ of the corresponding hole 51. In other words, the first conductive layer 50 is overlapped with both the conductive regions 107 and the insulating region 110 in the thickness direction (T1) of the cavity region 103.

Figure 6E:
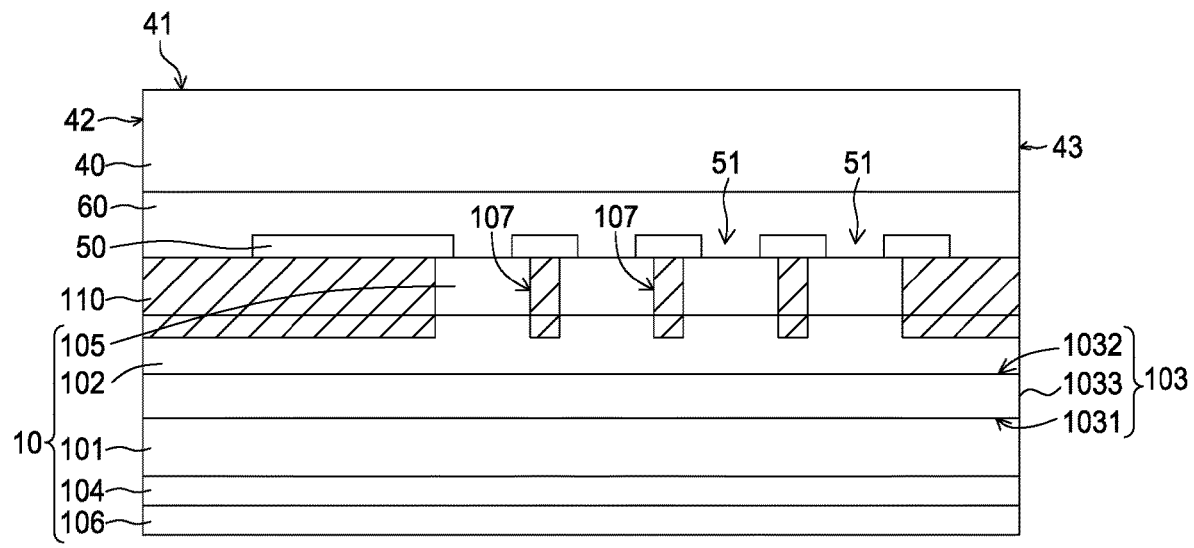

FIG. 6E is a schematic cross-sectional view after connecting to a substrate 40. Referring to FIG. 6E, the method for making the semiconductor device as shown in FIG. 5 further includes steps of providing a substrate 40; connecting the substrate 40 and the structured formed in FIG. 6D by a bonding layer 60; and removing the growth substrate 100 by any suitable method. A part of the bonding layer 60 is in the multiple holes 51 formed through the first conductive layer 50.

Figure 6F:
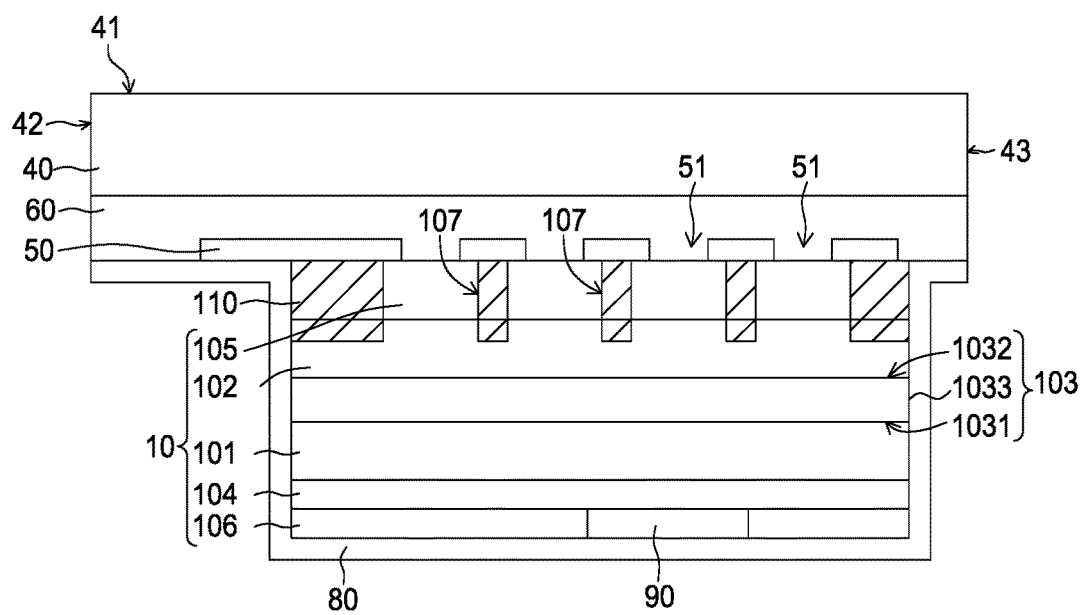

FIG. 6F is a schematic cross-sectional view after forming a first insulating layer 80. The method for making the semiconductor device as shown in FIG. 5 further includes steps of removing a periphery part of the semiconductor stack 10 by any suitable method such as ICP or wet etching to expose a part of the first conductive layer 50 and a part of the bonding layer 60; removing a part of the etching stop layer 106 to expose a part of the first semiconductor contact layer 104; forming a metal contact layer 90 including alloy such as GeAuNi to directly contact the exposed part of the first semiconductor contact layer 104; and forming a first insulating layer 80 on a bottom surface of the etching stop layer 106 opposite to the substrate 40, covering a sidewall of the etching stop layer 106, covering a sidewall of the first reflective structure 101, covering the sidewall 1033 of the cavity region 103, covering a sidewall of the insulating region 110 and on the exposed surface of the bonding layer 60. The first insulating layer 80 is in direct contact with the exposed part of the first conductive layer 50. In the present embodiment, the first insulating layer 80 is also in direct contact with the bonding layer 60.

The method for making the semiconductor device further includes steps of removing a part of the first insulating layer 80 and forming a first electrode 20 and a second electrode 30 to finish the semiconductor device as shown in FIG. 5. As shown in FIG. 5, a part of the first insulating layer 80 on the first conductive layer 50 is removed to form a ditch (not labeled) for exposing a part of the first conductive layer 50, and a part of the first insulating layer 80 is removed to expose a part of the etching stop layer 106 and a part of the metal contact layer 90 at the same time. In another embodiment, the first insulating layer 80 can be removed to expose a part of the metal contact layer 90 without exposing the etching layer 106. The ditch divides the first insulating layer 80 into a first region 801 and a second region 802 from a cross-sectional view of the unfinished semiconductor device. The first region 801 covers the sidewall of the semiconductor stack 10.

The first electrode 20 is directly in contact with the exposed part of the metal contact layer 90, and preferably, is in direct contact with the exposed part of the metal contact layer 90, the exposed part of the etching stop layer 106 and the first insulating layer 80 at the same time. The second electrode 30 is separated from the first electrode 20 and is on the first insulating layer 80. Specifically, the second electrode 30 covers the first region 801. A part of the side portion 32 of the second electrode 30 is in the ditch to be in direct contact with the exposed part of the electrode layer 50.

Figure 7:
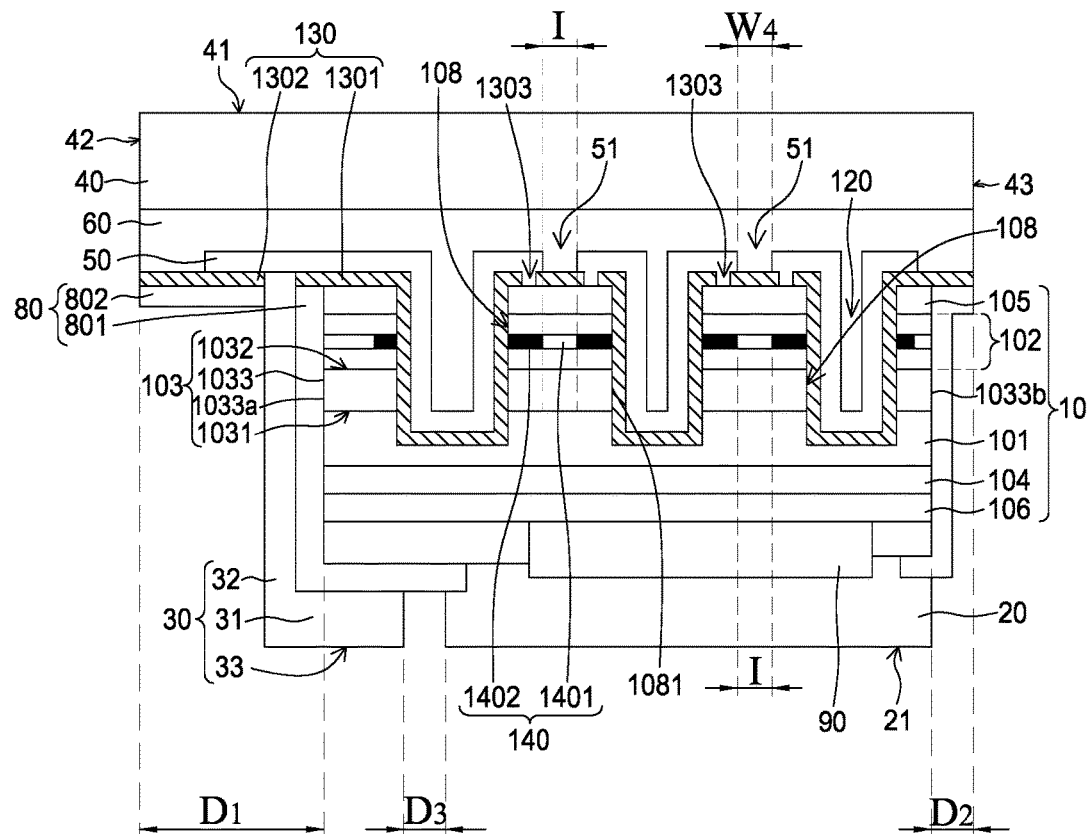
FIG. 7 is a schematic cross-sectional view of a fourth embodiment of the semiconductor device.

FIG. 7 is a schematic cross-sectional view of a fourth embodiment of the semiconductor device. The semiconductor device in accordance with the fourth embodiment of the present disclosure includes substantially the same structure as the first embodiment, and the difference is described below. Referring to FIG. 7, the semiconductor stack 10 includes multiple columnar structures 108 separated from each other by a trench 120. Each of the columnar structures 108 includes the same structure, that is, each of the columnar structures 108 sequentially includes the first reflective structure 101, the cavity region 103, the second reflective structure 102, and the second semiconductor contact layer 105 as mentioned in the first embodiment.

Each of the columnar structures 108 includes an outer wall 1081 exposed by the trench 120. Specifically, the trench 120 penetrates through the second semiconductor contact layer 105. Preferably, the trench 120 further penetrates through the second reflective structure 102 and through the cavity region 103 to expose the first reflective structure 101. As a result, the outer walls 1081 of the columnar structures 108 are exposed. The outer wall 1081 is farther from the first face 42, second face 43, third face 44, and fourth face 45 of the substrate 40 than the sidewall 1033 of the cavity region 103. The shapes of the columnar structures 108 can be, but not limited to, ellipse, rectangular, square, rhombus or any other shape from a top view of the columnar structures 108.

The semiconductor device further includes a second insulating layer 130 conformably covering the columnar structures 108. Specifically, the second insulating layer 130 covers a top surface of the second semiconductor contact layer 105 facing the substrate 40, covers along the outer walls 1081 of the multiple columnar structures 108, and covers a top surface of the first reflective structure 101 exposed by the trench 120. Specifically, the second insulating layer 130 is between the first conductive layer 50 and the first electrode 20. The second insulating layer 130 is overlapped with the first insulating layer 80 in the thickness direction (T1) of the cavity region 103. In other words, the second insulating layer 130 is overlapped with both the second electrode 30 and the first insulating layer 80 in the thickness direction (T1) of the cavity region 103. Specifically, the second insulating layer 130 is overlapped with both the pad portion 31 of the second electrode 30 and the first insulating layer 80 in the thickness direction (T1) of the cavity region 103.

In the present embodiment, the second insulating layer 130 is between the second region 802 of the first insulating layer 80 and the bonding layer 60. The second insulating layer 130 is in direct contact with both the first conductive layer 50 and the binding layer 60. Specifically, the second insulating layer 130 includes a third region 1301 and a fourth region 1302 separated from the third region 1301 by the side portion 32 of the second electrode 30. The third region 1301 is overlapped with both the semiconductor stack 10 and the first conductive layer 50 in the thickness direction (T1) of the cavity region 103. The fourth region 1302 of the second insulating layer 130 is overlapped with both the second region 802 of the first insulating layer 80 and the bonding layer 60 in the thickness direction (T1) of the cavity region 103.

Referring to FIG. 7, in the present embodiment, the second insulating layer 130 has an optical thickness substantially equal to $N\lambda/4$, wherein $\lambda$ is the peak wavelength of the radiation emitted from the cavity region 103, and N is an odd positive integer. In the present embodiment, $\lambda$ is about 940±10 nm. In another embodiment, $\lambda$ is about 905±10 nm. In another embodiment, $\lambda$ is about 850±10 nm. In another embodiment, the thickness of the second insulating layer 130 is between about 300 nm and 400 nm both inclusive. The semiconductor device includes multiple openings 1303 formed through the second insulating layer 130. Each of the openings 1303 is directly on one of the multiple columnar structures 108. Each of the openings 1303 exposes a part of the underlying second semiconductor contact layer 105 of the corresponding columnar structure 108. Specifically, the shape of one of or each of the openings 1303 is, but not limited to, ring in a top view of the second insulating layer 130.

Referring to FIG. 7, the first conductive layer 50 is conformably on the second insulating layer 130. Specifically, a part of the first conductive layer 50 is in the openings 1303 formed through the second insulating layer 130 to be in direct contact with the second semiconductor contact layer 105 of one or more of the columnar structures 108. The semiconductor device of the present embodiment is devoid of the second conductive layer 70, which is interposed between the second reflective structure 102 and the bonding layer 60 as described in the first embodiment.

Referring to FIG. 7, in the present embodiment, the semiconductor device includes a current confinement layer 140 in each columnar structure 108. Preferably, the current confinement layer 140 is in the second reflective structure 102. The current confinement layer 140 includes a conductive area 1401 and an insulating area 1402 surrounding the conductive area 1401. The portions of the cavity region 103 directly under the conductive area 1401 function as main radiation emitting regions I, and the radiation emitted from the main radiation emitting regions I escapes to the outside of the semiconductor device from the substrate 40 through the holes 51 formed in the first conductive layer 50.

The conductive area 1401 includes group III-V semiconductor materials including Al, such as $Al_{a1}Ga_{(1-a1)}As$, wherein $0.9 \leq a1 \leq 1.0$. The aluminum content of the conductive area 1401 is higher than the aluminum content (n) of the first semiconductor layers or aluminum content (m) of the second semiconductor layers in the second reflective structure 102 and/or the first reflective structure 101. For example, the conductive area 1401 includes $Al_{a2}Ga_{1-a2}As$, wherein $0.9 \leq a2 \leq 0.99$. The insulating area 1402 includes oxide. Preferably, the insulating area 1402 includes aluminum oxide having an empirical formula $Al_cO_d$, wherein c and d are natural numbers excluding 0. In the present embodiment, the current confinement layer 140 is inserted in the second reflective structure 102 to be between one of the first semiconductor layers and an adjacent second semiconductor layer. In another embodiment, one of the second semiconductor layers or one of the first second semiconductor layers of the second reflective structure 102 is replaced with the current confinement layer 140 in each of the columnar structures 108. Each of the holes 51 formed through the first conductive layer 50 is directly above the conductive area 1401 of the corresponding current confinement layer 140. Preferably, the pad portion 31 of the second electrode 30 is not overlapped with the conductive areas 1401 of the columnar structures 108 in a thickness direction (T1) of the cavity region 103. In one embodiment, the pad portion 31 of the second electrode 30 is not overlapped with the holes 51 formed through the first conductive layer 50 in a thickness direction (T1) of the cavity region 103. Each of the conductive areas 1401 has a width. Preferably, the width of one of the conductive areas 1401 is less than the fourth width $W_4$ of the corresponding hole 51. Preferably, the width of one of the conductive areas 1401 is not less than 3 μm, and preferably, is not more than 20 μm.

Figure 8A:
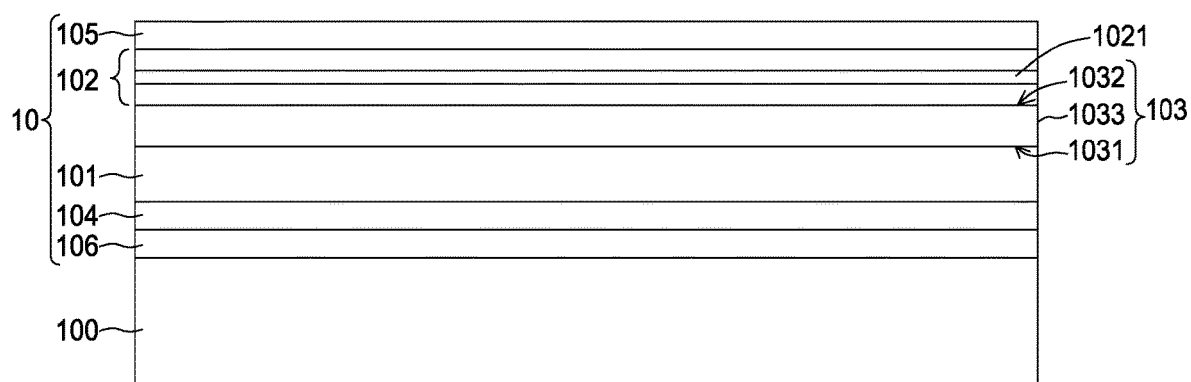
FIG. 8A through FIG. 8I demonstrate the method for manufacturing the semiconductor device shown in FIG. 7.

FIG. 8A through FIG. 8I demonstrate the method for manufacturing the semiconductor device shown in FIG. 7. FIG. 8A is a schematic cross-sectional view after forming the second semiconductor contact layer 105. Referring to FIG. 8A, the method for making the semiconductor device as shown in FIG. 7 includes the steps of providing a growth substrate 100; and forming a semiconductor stack 10 as mentioned in the first embodiment on the growth substrate 100 by epitaxial growth, wherein the semiconductor stack 10 includes a second reflective structure 102 including alternating first semiconductor layers and second semiconductor layers as mentioned in the first embodiment. The difference between the present embodiment and the first embodiment is that a third semiconductor layer 1201 is formed between one of the first semiconductor layers and an adjacent second semiconductor layer in the second reflective structure 102. The third semiconductor layer 1201 has a third refractive index lower than the second refractive index of each of the second semiconductor layers. In one embodiment, the third semiconductor layer 1201 has a third Al content higher than the second Al content of each of the second semiconductor layers. In the present embodiment, the first semiconductor layers includes $Al_nGa_{(1-n)}As$, the second semiconductor layers includes $Al_mGa_{(1-m)}As$, and the third semiconductor layer 1201 includes $Al_fGa_{(1-f)}As$, wherein f>m>n.

Figure 8B:
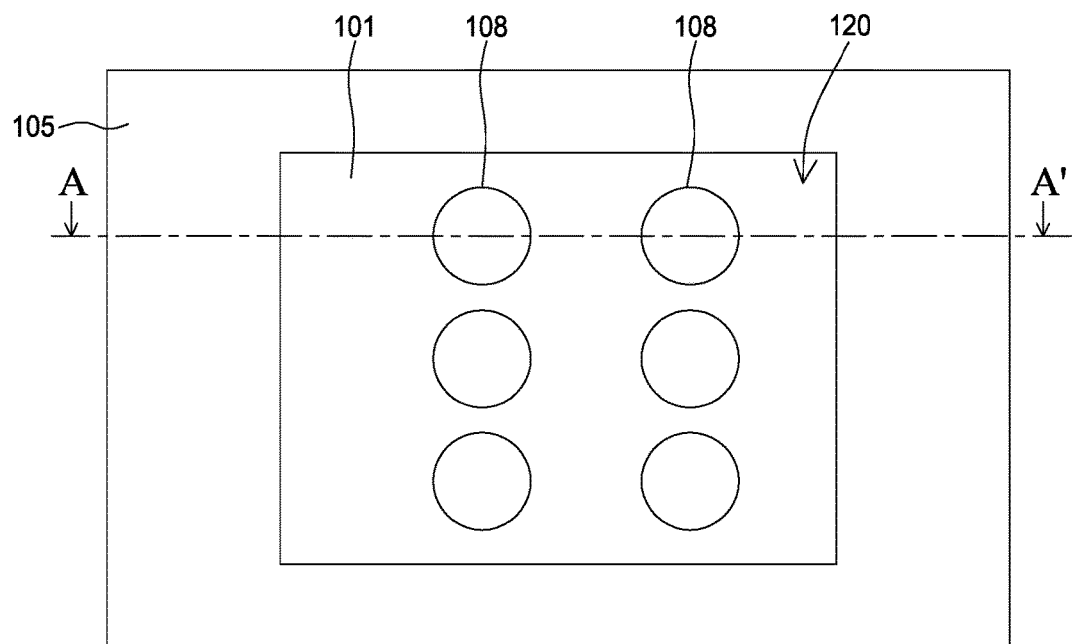
Figure 8C:
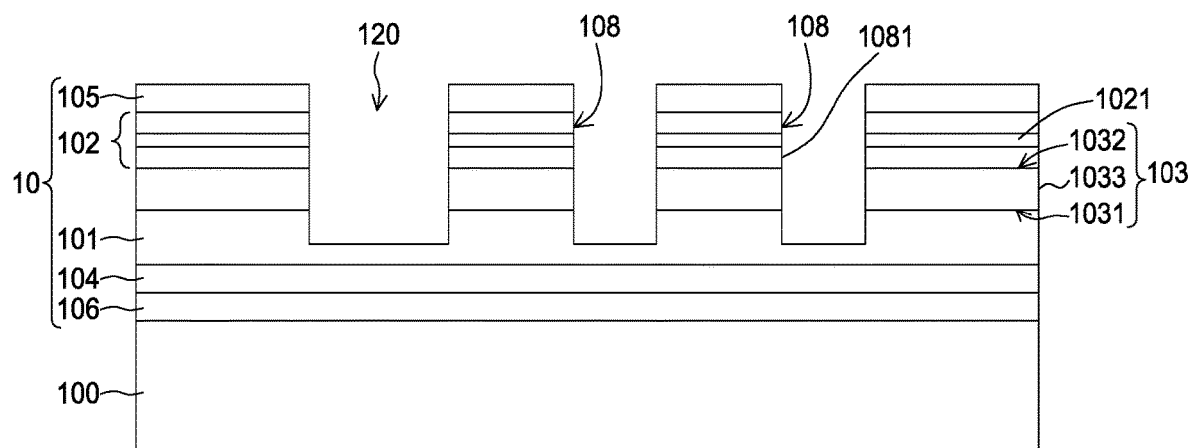

FIG. 8B is a schematic top view after forming multiple columnar structures 108. FIG. 8C is a schematic cross-sectional view along an A-A' line shown in FIG. 8B. Referring to FIG. 8B and FIG. 8C, the method for making the semiconductor device as shown in FIG. 7 further includes the steps of removing a part of the semiconductor stack 10 by any suitable methods to form a trench 120 and multiple columnar structures 108. The multiple columnar structures 108 are separated from one another or each other by the trench 120, and each of the columnar structures 108 includes an outer wall 1081, and preferably, the trench 120 exposes a top surface of the first reflective structure 101.

Figure 8D:
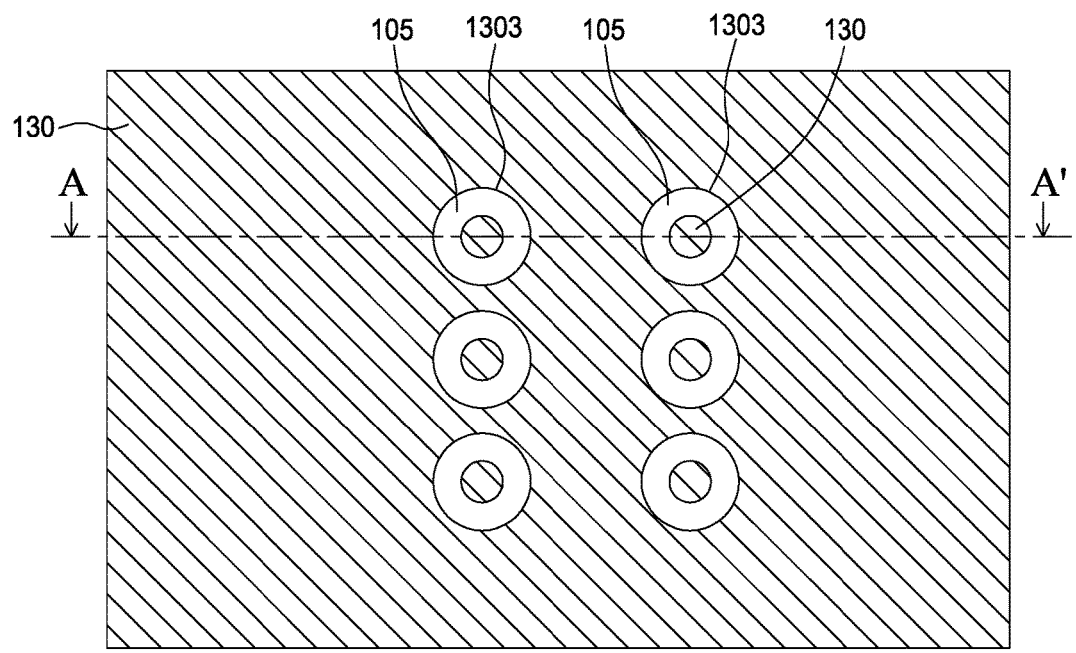
Figure 8E:
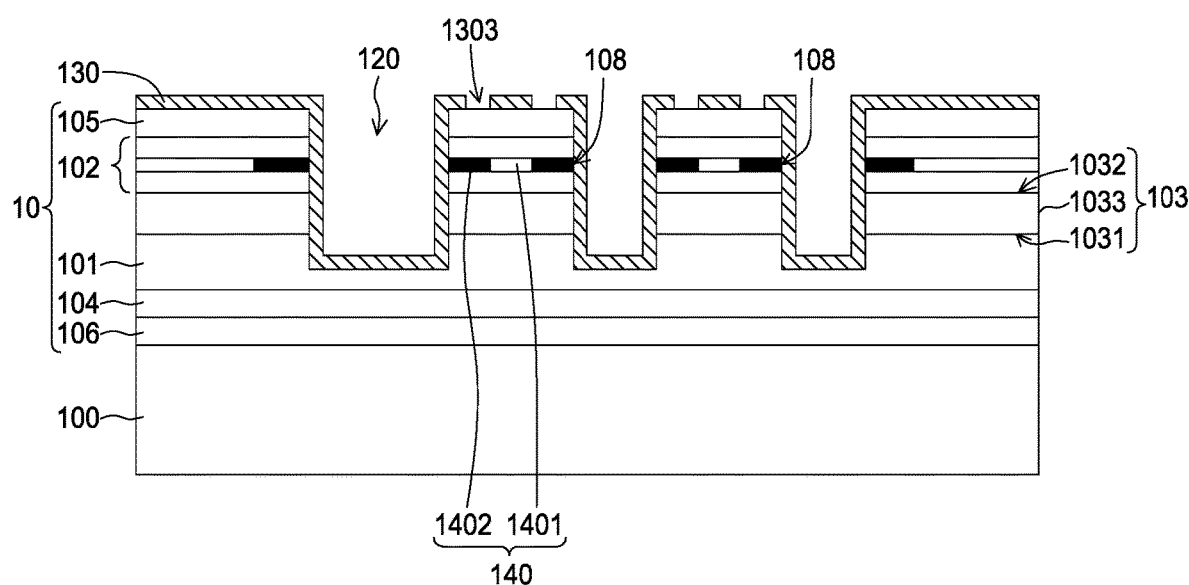

FIG. 8D is a schematic top view after forming the second insulating layer 130. FIG. 8E is a schematic cross-sectional view along an A-A' line shown in FIG. 8D. Referring to FIG. 8D and FIG. 8E, the method for making the semiconductor device as shown in FIG. 7 further includes the steps of oxidizing the third semiconductor layer 1201 to form a current confinement layer 140 including a conductive area 1401 and an insulating area 1402 surrounding the conductive area 1401; forming a second insulating layer 130 covering a top surface of the second semiconductor contact layer 105 facing the substrate 40, covering along the outer walls 1081 of the multiple columnar structures 108, and covering a top surface of the first reflective structure 101 exposed by the trench 120; and removing a part of the second insulating layer 130 on the multiple columnar structures 108 to form multiple openings 1303 for exposing the underlying second semiconductor contact layer 105. The third semiconductor layer 1201 with the third Al content higher than both the second Al content and the first Al content is oxidized from the outer wall 1081 exposed by the trench 120.

Figure 8F:
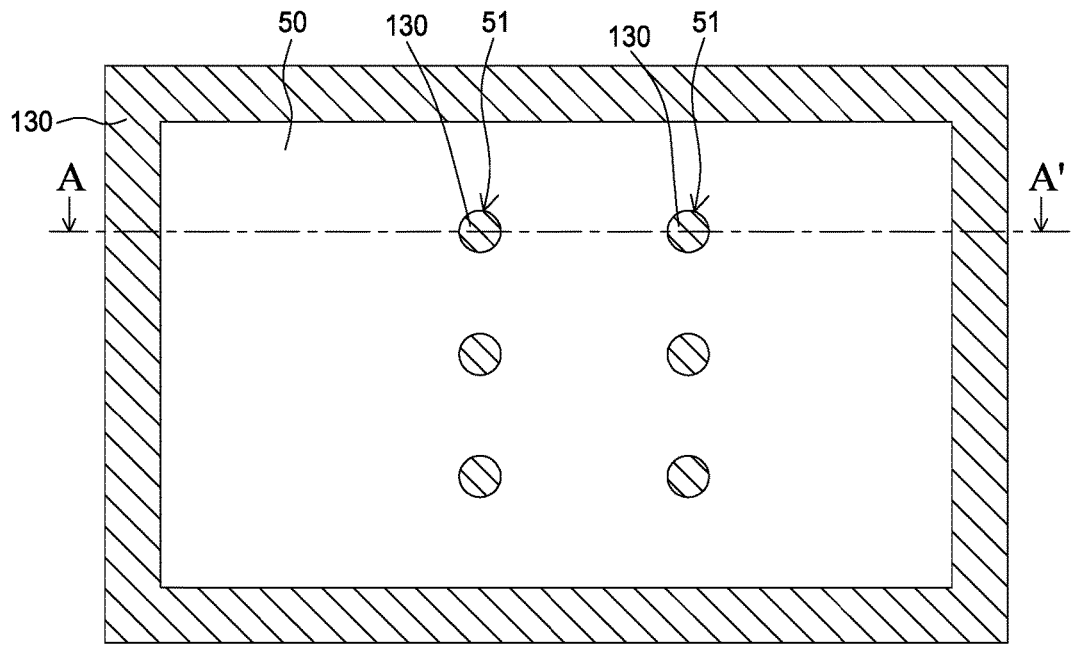
Figure 8G:
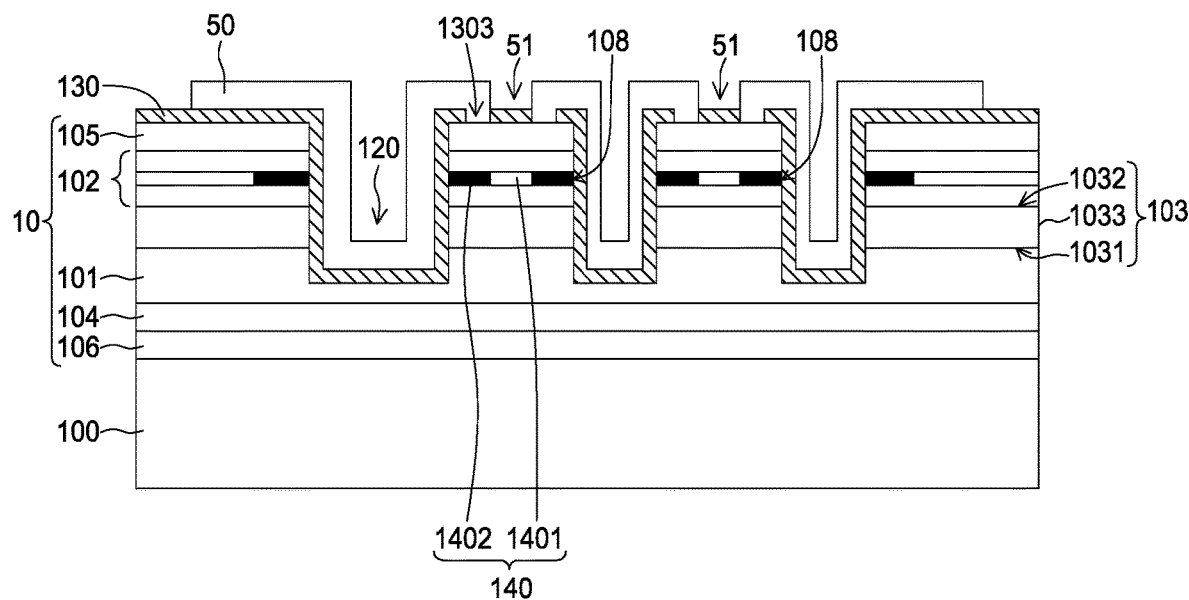

FIG. 8F is a schematic top view after forming the first conductive layer 50. FIG. 8G is a schematic cross-sectional view along an A-A' line shown in FIG. 8F. Referring to FIG. 8F and FIG. 8G, the method for making the semiconductor device as shown in FIG. 7 further includes the steps of forming a current-conducting layer (not shown) on the second insulating layer 130 and in the openings 1303 to be in direct contact with the second semiconductor contact layer 105; patterning the current-conducting layer by a lithographic mask to form a first conductive layer 50. After patterning the current-conducting layer, multiple holes 51 are formed though the first conductive layer 50. Each of the multiple holes 51 is directly above the conductive area 1401 of the current confinement layer 140 of one of the columnar structures 108, and the holes 51 expose a part of the underlying second insulating layer 105.

Figure 8H:
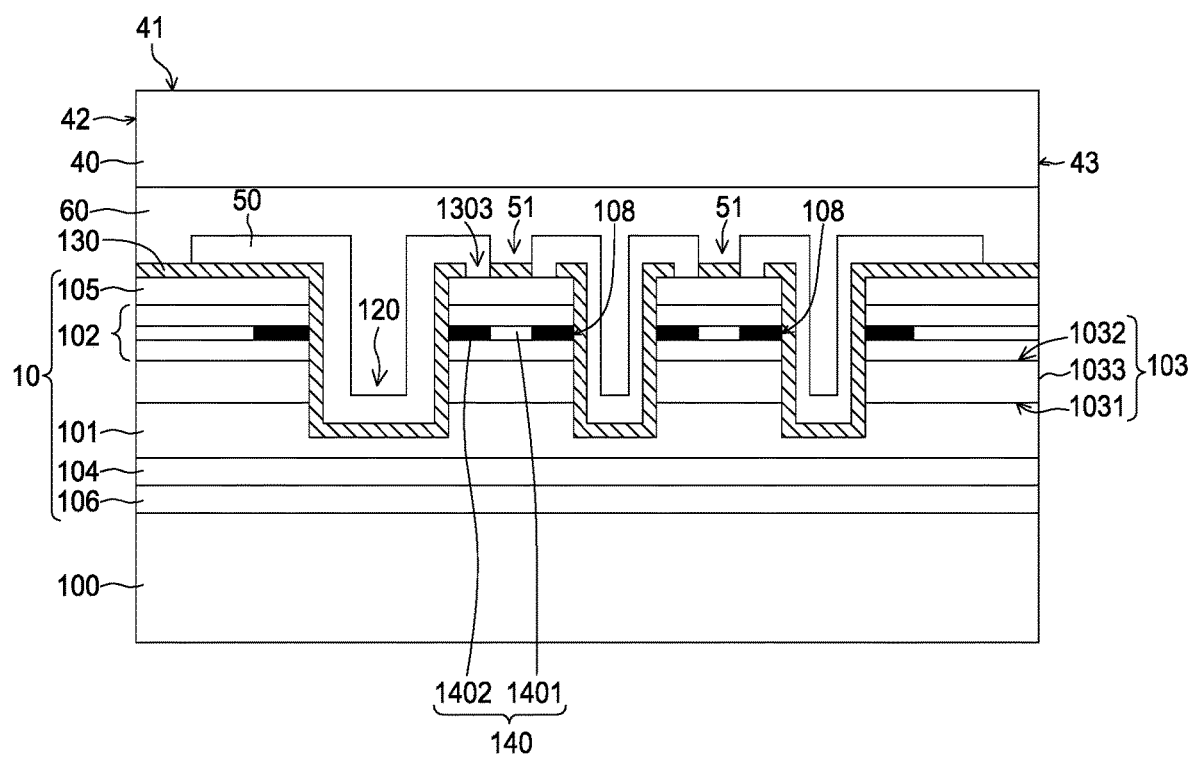

FIG. 8H is a schematic cross-sectional view after connecting to a substrate 40. Referring to FIG. 8H, the method for making the semiconductor device as shown in FIG. 7 further includes the steps of providing a substrate 40; and connecting the substrate 40 and the structured of FIG. 8G by a bonding layer 60. A part of the bonding layer 60 is in the multiple holes 51 formed through the first conductive layer 50.

Figure 8I:
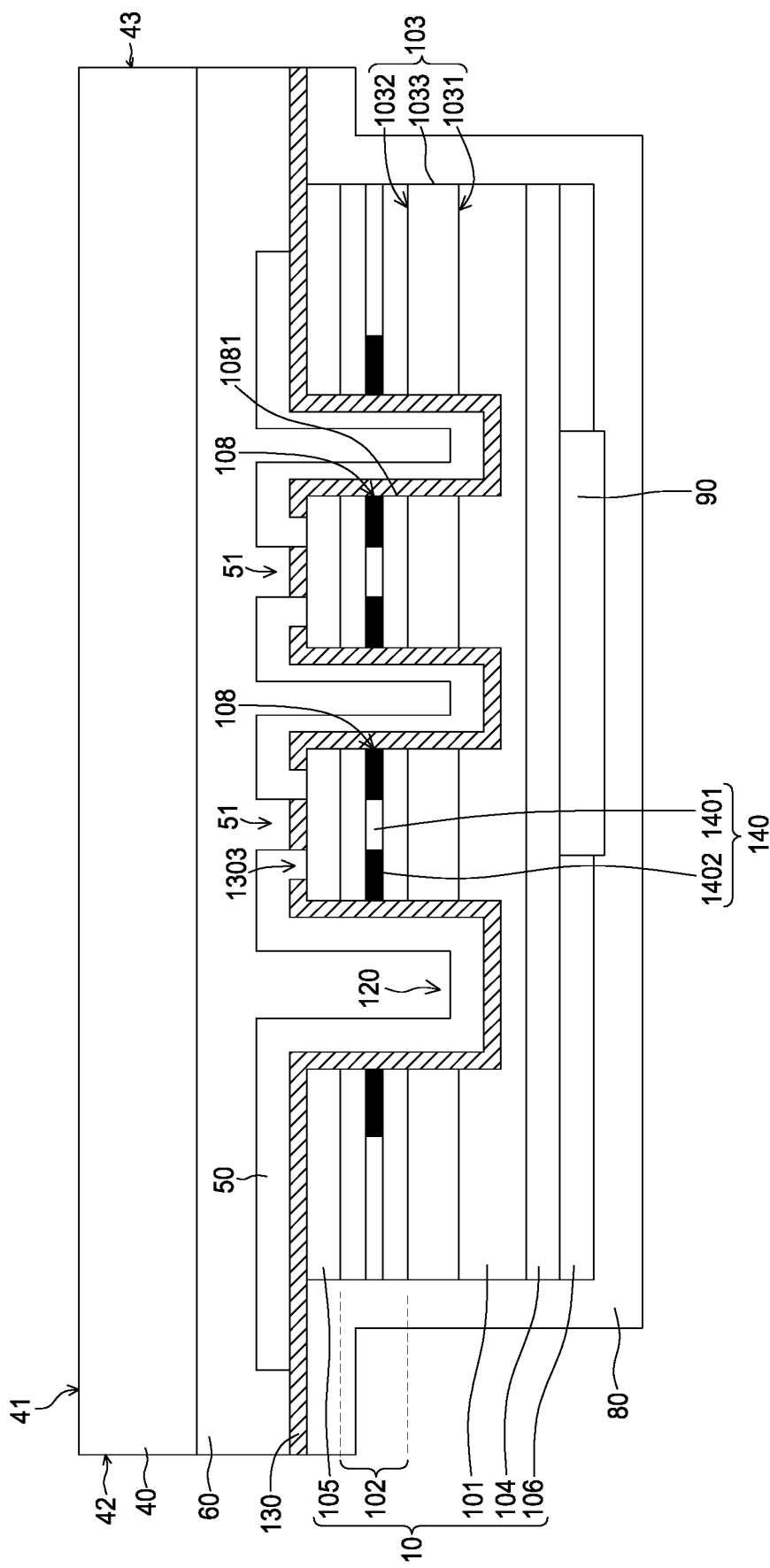

FIG. 8I is a schematic cross-sectional view after forming a first insulating layer 80. Referring to FIG. 8I, the method for making the semiconductor device as shown in FIG. 7 further includes the steps of removing the growth substrate 100; removing a periphery part of the semiconductor stack 10 by any suitable method such as ICP or wet etching so as to expose a part of the second insulating layer 130; removing a part of the etching stop layer 106 to expose the first semiconductor contact layer 104; forming a metal contact layer 90 including alloy such as GeAuNi to directly contact the first semiconductor contact layer 104; and forming a first insulating layer 80 on a top surface of the etching stop layer 106 opposite to the substrate 40, covering a sidewall of the semiconductor stack 10, and covering the second insulating layer 130.

The method for making the semiconductor device as shown in FIG. 7 further includes the steps of removing a part of the first insulating layer 80 and a part of the second insulating layer 130 and forming the first electrode 20 and the electrode 30 to finish the semiconductor device as shown in FIG. 7. As shown in FIG. 7, a part of the first insulating layer 80 and a part of the second insulating layer 130 are removed at the same time to from a ditch (not labeled) for exposing a part of the first conductive layer 50, and a part of the first insulating layer 80 is removed to expose the metal contact layer 90 and the etching stop layer 106 at the same time. In another embodiment, the first insulating layer 80 can be removed to expose a part of the metal contact layer 90 without exposing the etching layer 106. The ditch divides the first insulating layer 80 into a first region 801 and a second region 802 and to divide the second insulating layer 130 into a third region 1301 and a fourth region 1302 from a cross-sectional view of the unfinished semiconductor device.

The first electrode 20 is in direct contact with the metal contact layer 90, and preferably, is in direct contact with the metal contact layer 90, the etching stop layer 106 and the first insulating layer 80 at the same time. The second electrode 30 is separated from the first electrode 20 and is on the first insulating layer 80. Specifically, the second electrode 30 covers the first region 801 of the first insulating layer 80, and a part of the side portion 32 of the second electrode 30 is in the ditch to be in direct contact with the exposed part of the first conductive layer 50. In other words, in a cross-sectional view of the semiconductor device, the side portion 32 of the second electrode 30 is between the first region 801 of the first insulating layer 80 and the second region 802 of the first insulating layer 80 and is between the third region 1301 of the second insulating layer 130 and the fourth region 1302 of the second insulating layer 130 to be in direct contact with the exposed part of the first conductive layer 50.

Figure 9:
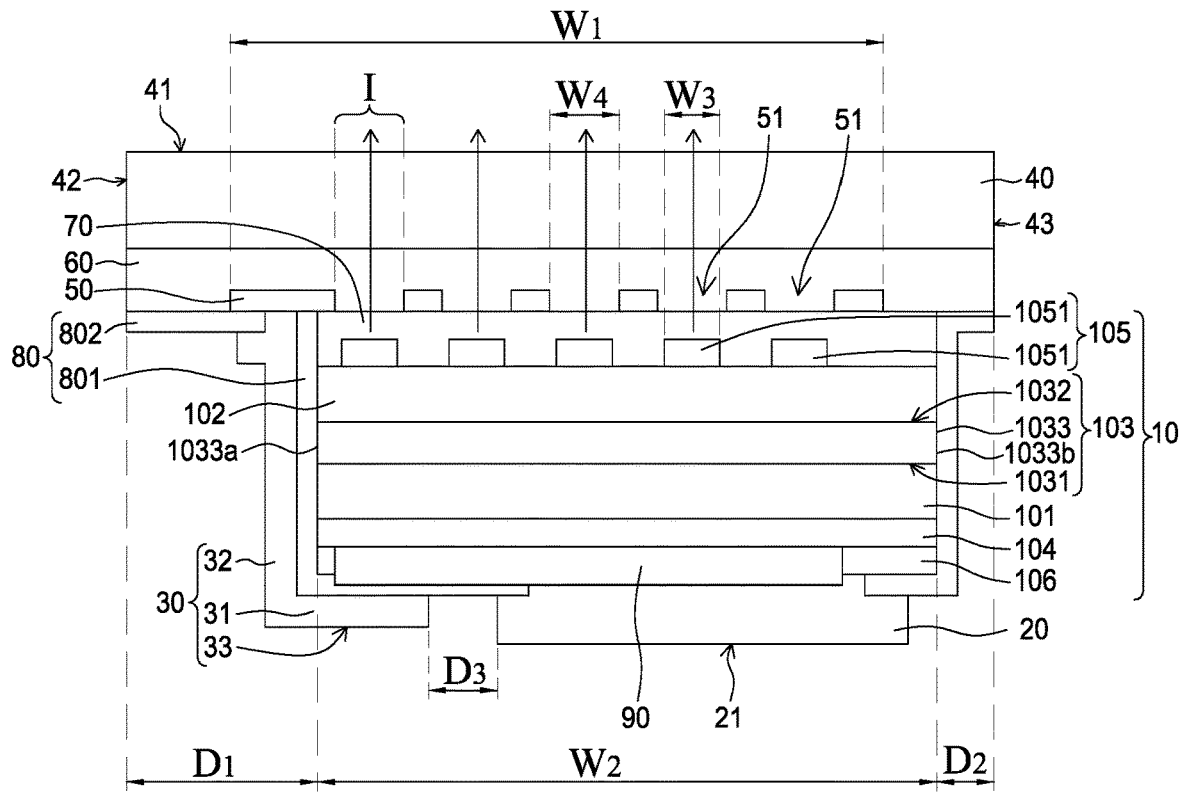
FIG. 9 is a schematic cross-sectional view of a fifth embodiment of the semiconductor device.

FIG. 9 is a schematic cross-sectional view of a fifth embodiment of the semiconductor device. The semiconductor device in accordance with the fifth embodiment of the present disclosure includes substantially the same structure as the first embodiment, and the difference is that the metal contact layer 90 is between the first insulating layer 80 and the semiconductor stack 10. Specifically, the metal contact layer 90 is overlapped with all of the holes 51 formed through the first conductive layer 50 and the contact regions 1051 in the thickness direction (T1) of the cavity region 103 in a cross-sectional view of the semiconductor device.

Figure 10:
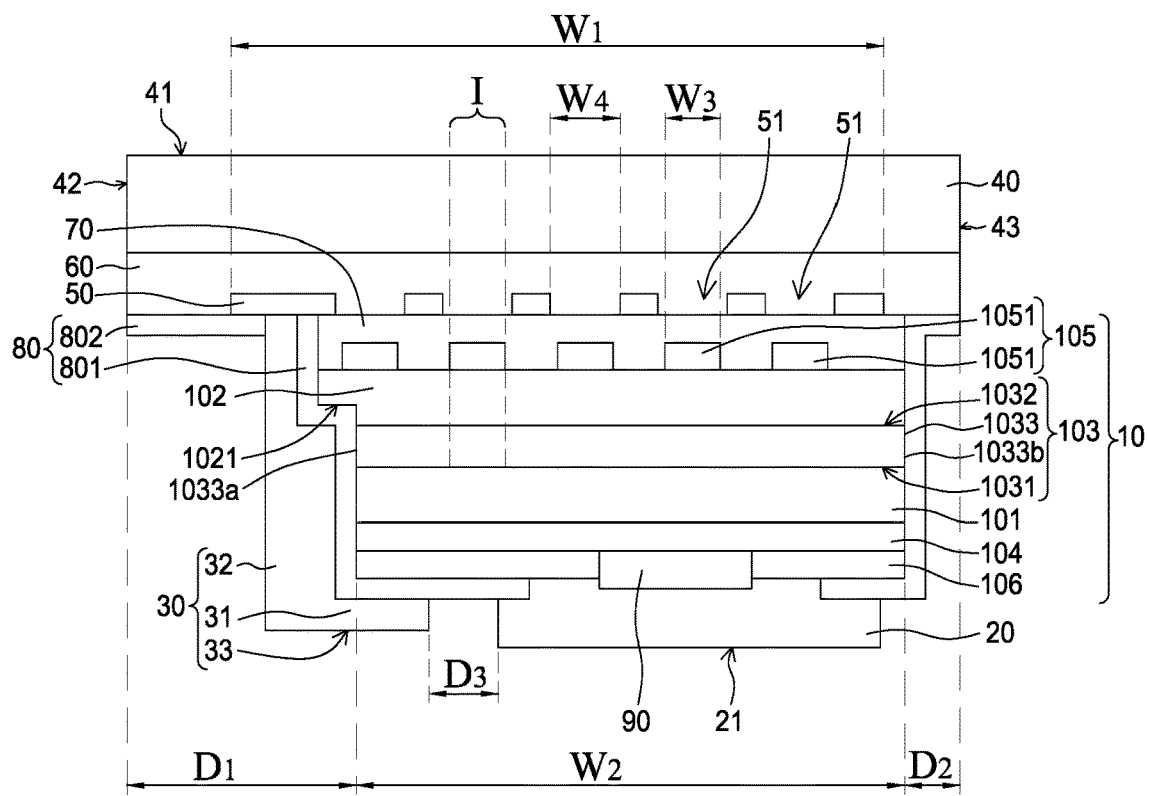
FIG. 10 is a schematic cross-sectional view of a sixth embodiment of the semiconductor device.

FIG. 10 is a schematic cross-sectional view of a sixth embodiment of the semiconductor device. The semiconductor device in accordance with the sixth embodiment of the present disclosure includes substantially the same structure as the first embodiment, and the difference is that the second reflective structure 102 includes a mesa structure 1021. Specifically, the second reflective structure 102 has two different widths. One of the widths is substantially the same as the second width $W_2$ of the cavity region 103. The other width is greater than the second width $W_2$ of the cavity region 103.

The method for making the semiconductor device as shown in FIG. 10 is substantially the same as the method for making the semiconductor device as shown in FIGS. 1 and 2. The difference is shown below. After forming the structure of 3E, the method for making the semiconductor device includes the steps of removing a periphery part of the etching stop layer 106, a periphery part of the first semiconductor contact layer 104, a periphery part of the first reflective structure 101, a periphery part of the cavity region 103 and a lower periphery part of the second reflective structure 102 to form the mesa structure 1021; protecting the sidewall 1033 of the cavity region 103 by a protection layer (not shown); further removing an upper periphery part of the second reflective structure 102 and the periphery part of the second conductive layer 70 to expose the first conductive layer 50. During the step of removing the periphery part of the second conductive layer 70, a part of the exposed first conductive layer 50 may be removed, which leads to a problem of the splash of the conductive material of the first conductive layer 50. By protecting the sidewall 1033 of the cavity region 103 with the protection layer, the problem of the splash of the conductive material of the first conductive layer 50 attached to the sidewall 1033 of the cavity region 103, which is caused by removing a part of the exposed first conductive layer 50, may be avoided or alleviated. The problem of the splash of the conductive material of the first conductive layer 50 attached to the sidewall 1033 leads to a problem of leakage current. As a result, the problem of the leakage current of the semiconductor device may be avoided or alleviated.

Subsequently, a part of the etching stop layer 106 is removed, and then the first insulating layer 80, the first electrode 20 and the second electrode 30 are formed. The related description can be referred to the aforesaid paragraphs.

Figure 11A:
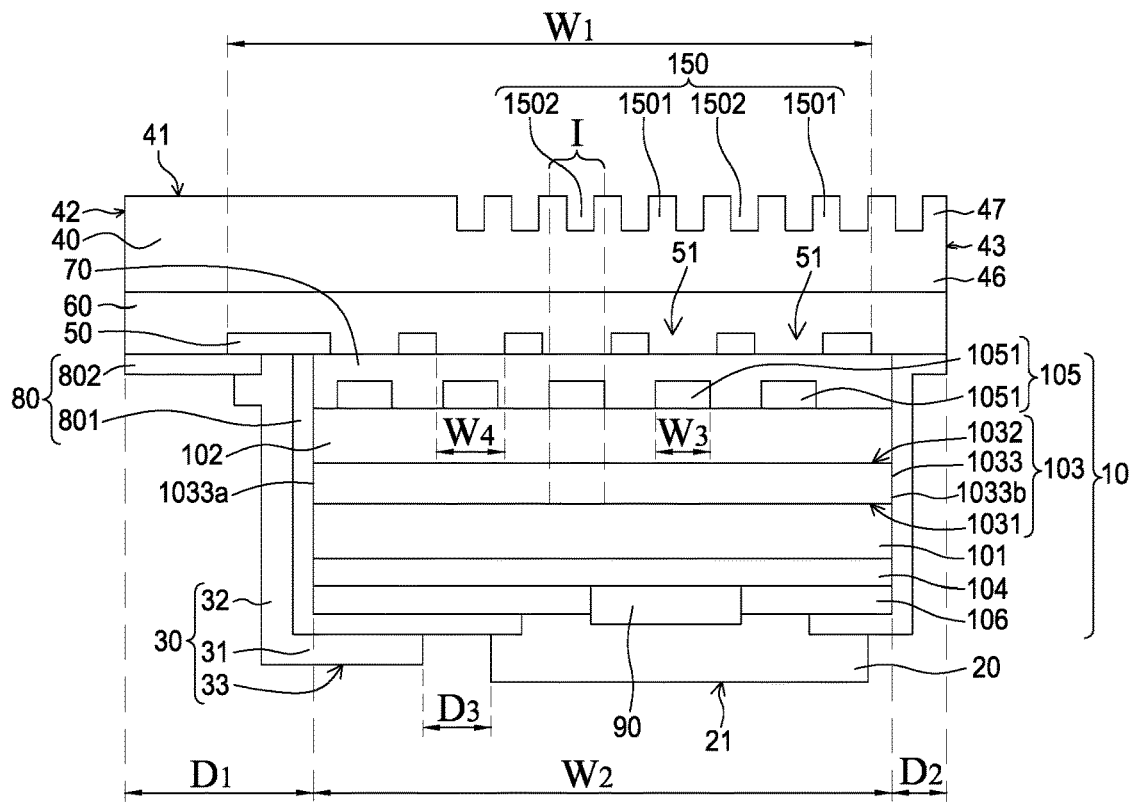
FIG. 11A is a schematic cross-sectional view of a seventh embodiment of the semiconductor device.

FIG. 11A is a schematic cross-sectional view of a seventh embodiment of the semiconductor device. The semiconductor device in accordance with the seventh embodiment of the present disclosure includes substantially the same structure as the first embodiment, and the difference is that the semiconductor device further includes an optical element 150. The optical element 150 is for changing the radiation pattern. In one embodiment, the optical element 150 is for enlarging or reducing the size of the radiation pattern. In one embodiment, the optical element 150 is for changing the direction or the shape of the radiation pattern. For example, the shape of the radiation pattern of the radiation emitted from the semiconductor device can be changed from a circle to a line by the optical element 150. From a cross section view of the semiconductor device, the optical element 150 includes alternating protrusions 1501 and grooves 1502. The shape of one of the protrusions 1501 includes rectangle, triangle or semi-circle from a cross-sectional view of the semiconductor device. The shapes of the protrusions 1501 can be the same of different. In one embodiment, the optical element 150 includes a fresnel lens.

In one embodiment, from a top view of the optical element 150, the protrusions 1501 and grooves 1502 can be arranged in a regular pattern including repeating units. In another embodiment, from a top view of the optical element 150, the protrusions 1501 and grooves 1502 can be arranged in an irregular pattern. In the present embodiment, the shape of any one of the protrusions 1501 of the optical element 150 includes rectangle from a cross-sectional view of the semiconductor device. In one embodiment, the height of one of the protrusions 1501 is between 0.3 μm and 5 μm. In the present embodiment, the height of one of the protrusions 1501 is between 0.5 and 1.5 μm. The heights of the protrusions 1501 can be the same or different. In the present embodiment, the heights of the protrusions 1501 are substantially the same.

Referring to FIG. 11A, more specifically, the substrate 40 includes a first side 46 and a second side 47 opposite to the first side 46, and the first side 46 is closer to the semiconductor stack 10 than the second side 47 is to the semiconductor stack 10. The first side 46 and the second side 47 are between the first face 42, the second face 43, the third face (not shown), and the fourth face (not shown). The second side 47 includes the top surface 41. In the present embodiment, the optical element 150 is formed in the second side 47. Specifically, a part of the substrate 40 is removed to form the optical element 150. The optical element 150 is overlapped with one or more of the main radiation emitting regions I in the thickness direction (T1) of the cavity region 103. In the present embodiment, the optical element 150 is overlapped with all of the main radiation emitting regions I in the thickness direction (T1) of the cavity region 103. In the present embodiment, the radiation escapes to the outside of the semiconductor device from the substrate 40 through the optical element 150.

Figure 11B:
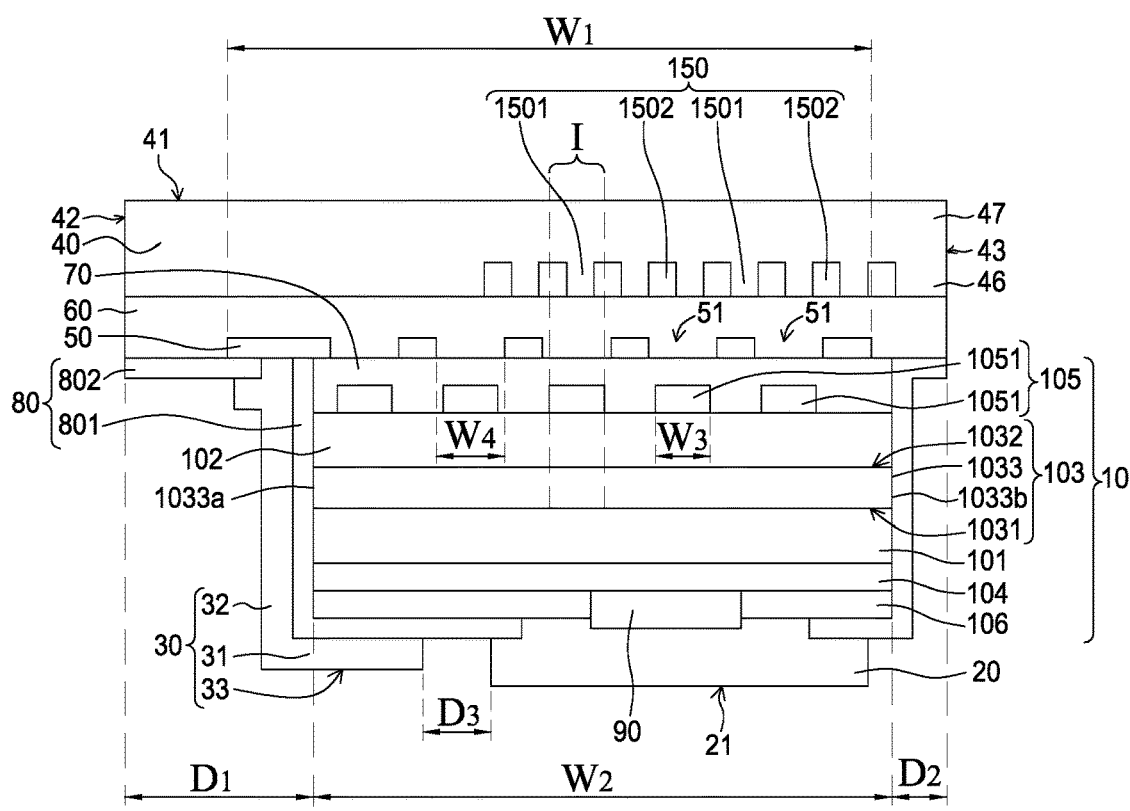
FIG. 11B is a schematic cross-sectional view of a eighth embodiment of the semiconductor device.

FIG. 11B is a schematic cross-sectional view of an eighth embodiment of the semiconductor device. The semiconductor device in accordance with the eighth embodiment of the present disclosure includes substantially the same structure as the seventh embodiment, and the difference is that the optical element 150 is formed at the first side 46. In the present embodiment, the optical element 150 is in direct contact with the bonding layer 60. Specifically, the protrusions 1501 of the optical element 150 are in direct contact with the bonding layer 60. In one embodiment. The multiple grooves 1502 can be filled with air or other material different from the material of the substrate 40. Preferably, the material filled in the groves 1502 is transparent to the radiation emitted from the cavity region 103. In one embodiment, the material filled in the groves 1502 is the same as the material of the bonding layer 60. If the material filled in the groves 1502 is the same as the material of the bonding layer 60, there won't be an interface between the grooves 1502 and the bonding layer 60.

Figure 11C:
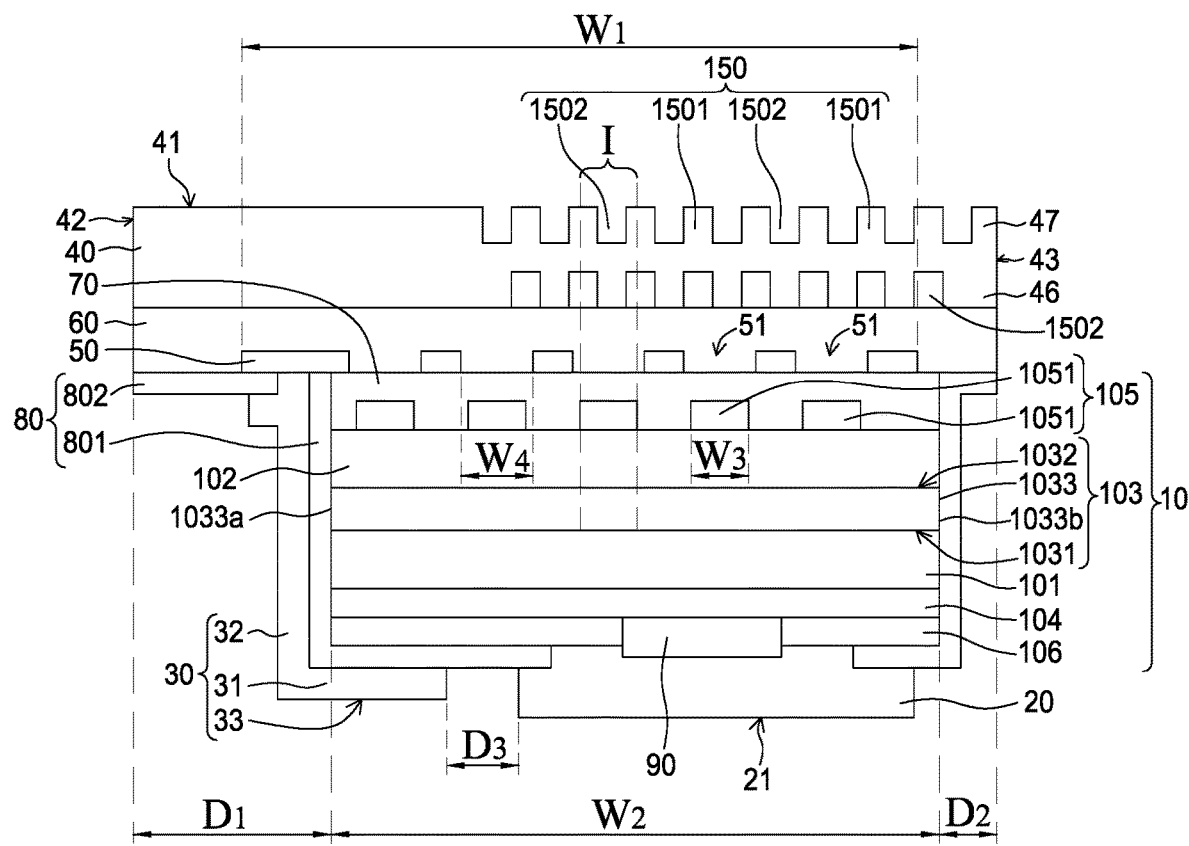
FIG. 11C is a schematic cross-sectional view of a ninth embodiment of the semiconductor device.

FIG. 11C is a schematic cross-sectional view of a ninth embodiment of the semiconductor device. The semiconductor device in accordance with the ninth embodiment of the present disclosure includes substantially the same structure as the seventh embodiment, and the difference is that the semiconductor device includes two optical elements 150. One of the optical elements 150 is at the first side 46 and the other optical element 150 is at the second side 47. The shapes of the two optical elements 150 from a cross-sectional view of the semiconductor device can be the same or different. Specifically, the shape of any one of the protrusions 1501 of one of the optical elements 150 and the shape of any one of the protrusions 1501 of the other optical element 150 from a cross-sectional view of the semiconductor device can be the same or different. In the present embodiment, the shape of any one of the protrusions 1501 of the optical element 150 at the second side 47 is rectangular from a cross-sectional view of the semiconductor device. The shape of any one of the protrusions 1501 of the optical element 150 at the first side 46 is rectangular from a cross-sectional view of the semiconductor device. The radiation emitted from the cavity region 103 has a radiation pattern. The radiation escapes to the outside of the semiconductor device from the substrate 40, and the radiation pattern of the radiation can be changed by the optical element 150 at the first side 46 first, and then the radiation pattern can be changed by the optical element 150 at the second side 47 again.

Figure 12A:
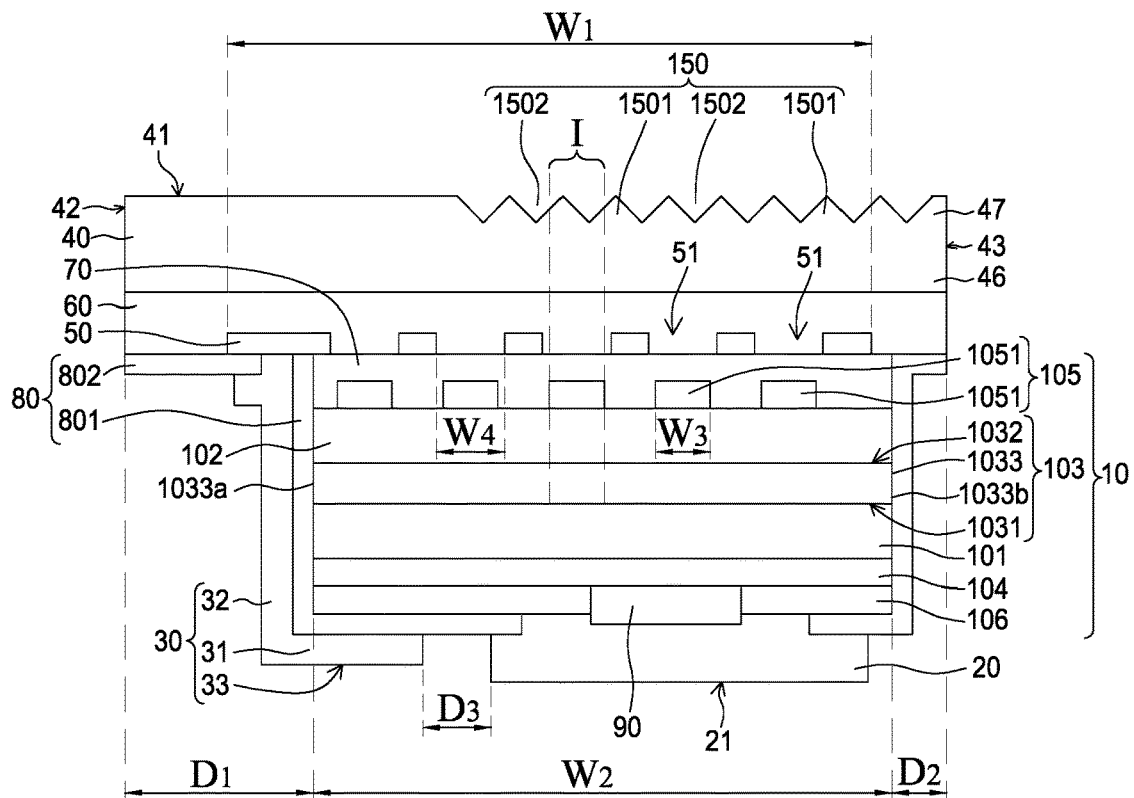
FIG. 12A is a schematic cross-sectional view of a tenth embodiment of the semiconductor device.

FIG. 12A is a schematic cross-sectional view of a tenth embodiment of the semiconductor device. The semiconductor device in accordance with the tenth embodiment of the present disclosure includes substantially the same structure as the seventh embodiment, and the difference is that the shapes of the protrusions 1501 from a cross-sectional view of the semiconductor device are different from that in the FIG. 11A. In the present embodiment, each of the shapes of the protrusions 1501 from a cross-sectional view of the semiconductor device is triangle.

Figure 12B:
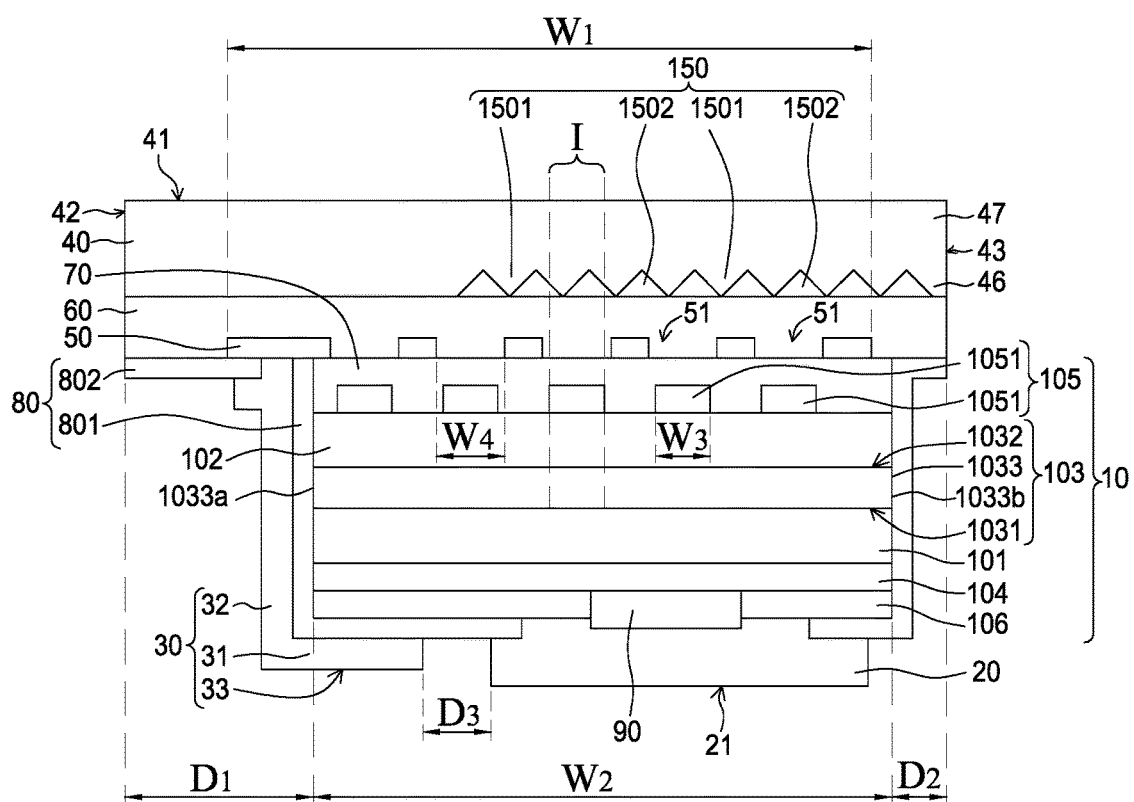
FIG. 12B is a schematic cross-sectional view of a eleventh embodiment of the semiconductor device.

FIG. 12B is a schematic cross-sectional view of an eleventh embodiment of the semiconductor device. The semiconductor device in accordance with the eleventh embodiment of the present disclosure includes substantially the same structure as the eighth embodiment, and the difference is that the shapes of the protrusions 1501 from a cross-sectional view of the semiconductor device are different from that in the FIG. 11B. In the present embodiment, each of the shapes of the protrusions 1501 is triangle from a cross-sectional view of the semiconductor device.

Figure 12C:
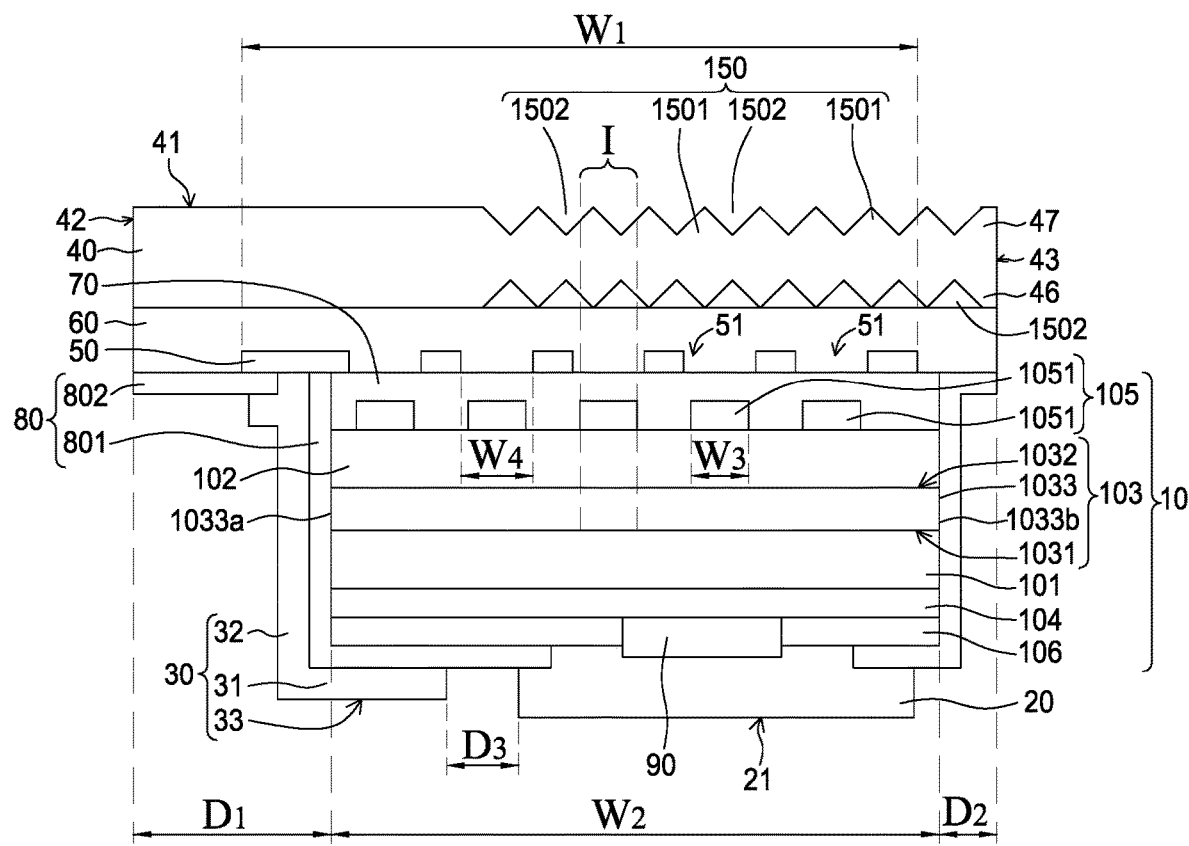
FIG. 12C is a schematic cross-sectional view of a twelfth embodiment of the semiconductor device.

FIG. 12C is a schematic cross-sectional view of a twelfth embodiment of the semiconductor device. The semiconductor device in accordance with the twelfth embodiment of the present disclosure includes substantially the same structure as the ninth embodiment, and the difference is that the shapes of the protrusions 1501 from a cross-sectional view of the semiconductor device are different from that in the FIG. 11C. In the present embodiment, the shape of each of the protrusions 1501 of the optical element 150 on the second side 47 is triangle from a cross-sectional view of the semiconductor device. The shape of each of the protrusions 1501 of the optical element 150 at the first side 46 is triangle from a cross-sectional view of the semiconductor device.

Figure 13A:
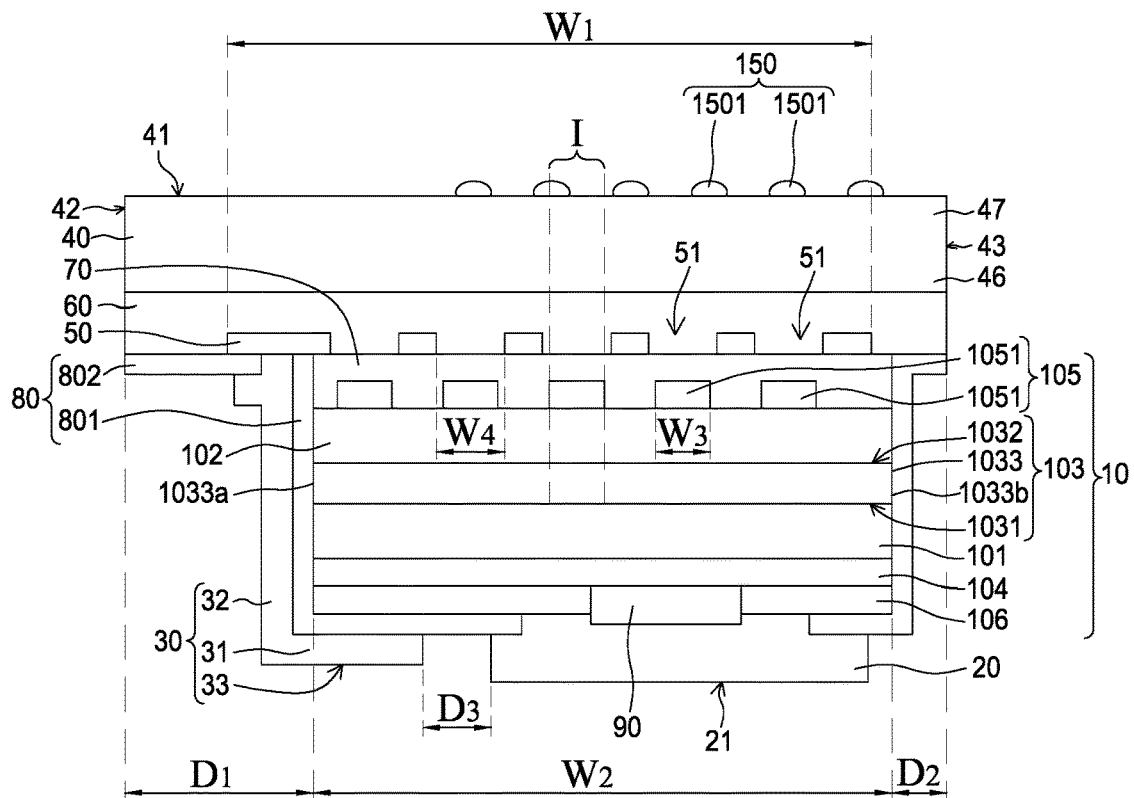
FIG. 13A is a schematic cross-sectional view of a thirteenth embodiment of the semiconductor device.

FIG. 13A is a schematic cross-sectional view of a thirteenth embodiment of the semiconductor device. The semiconductor device in accordance with the thirteenth embodiment of the present disclosure includes substantially the same structure as the seventh embodiment, and the difference is described below. The second side 47 of the substrate 40 includes the top surface 41. The optical element 150 is formed on the top surface 41. In the present embodiment, from the cross-sectional view of the semiconductor device, the optical element 150 includes multiple protrusions 1501 protruded from the top surface 41. The shapes of the protrusions 1501 from a cross-sectional view of the semiconductor device are different from that in the FIG. 11A. In the present embodiment, the shape of each of the protrusions 1501 is semi-circle. In one embodiment, the material of the optical element 150 is different from that of the substrate 40. The material of the optical element 150 includes Si, quartz, $SiO_2$ or $CaF_2$.

Figure 13B:
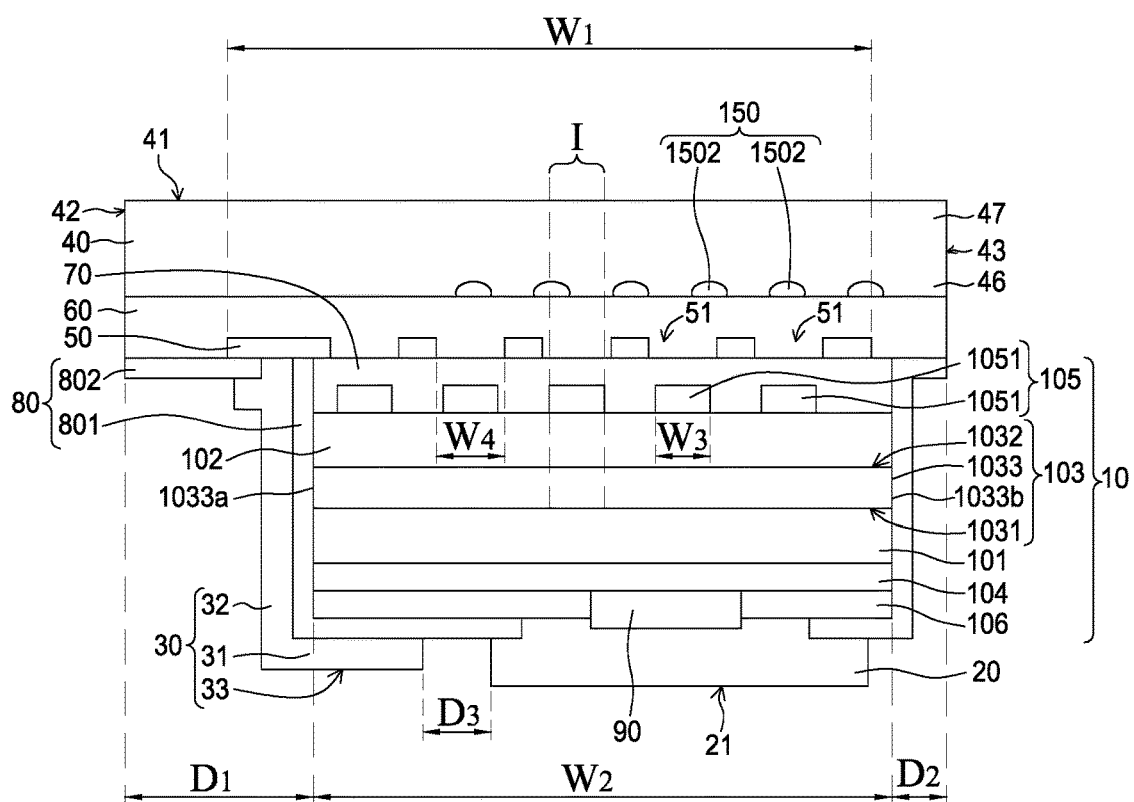
FIG. 13B is a schematic cross-sectional view of a fourteenth embodiment of the semiconductor device.

FIG. 13B is a schematic cross-sectional view of a fourteenth embodiment of the semiconductor device. The semiconductor device in accordance with the fourteenth embodiment of the present disclosure includes substantially the same structure as the eighth embodiment, and the difference is that the shapes of the grooves 1502 from a cross-sectional view of the semiconductor device are different from that in the FIG. 11B. In the present embodiment, each of the shapes of the grooves 1502 is semi-circle from a cross-sectional view of the semiconductor device.

Figure 13C:
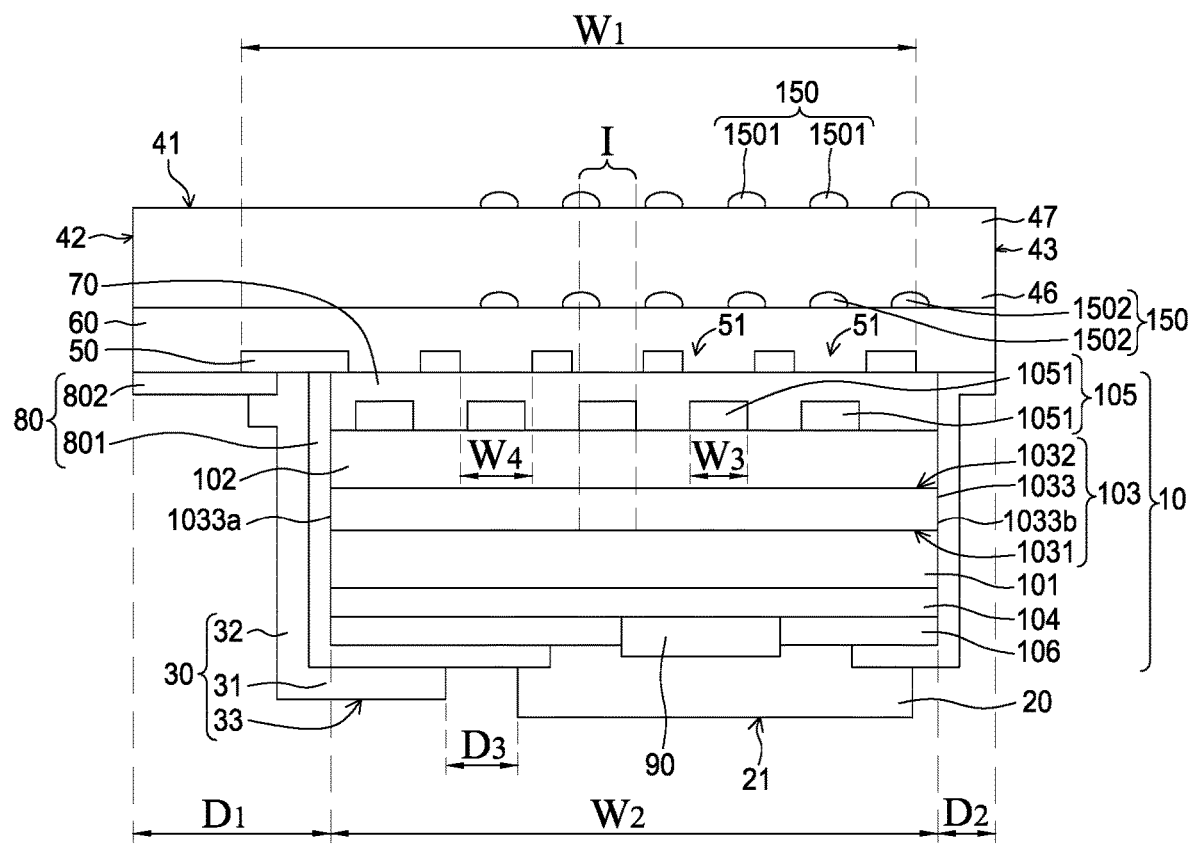
FIG. 13C is a schematic cross-sectional view of a fifteenth embodiment of the semiconductor device.

FIG. 13C is a schematic cross-sectional view of a fifteenth embodiment of the semiconductor device. The semiconductor device in accordance with the fifteenth embodiment of the present disclosure includes substantially the same structure as the thirteenth embodiment, and the difference is that the semiconductor device includes two optical elements 150. One of the optical elements 150 is at the first side 46 and the other optical element 150 is on the top surface 41 of the second side 47. In the present embodiment, the shape of any one of the protrusions 1501 of the optical element 150 on the top surface 41 of the second side 47 is semi-circle from a cross-sectional view of the semiconductor device. The shape of any one of the grooves 1502 of the optical element 150 on the first side 46 is semi-circle from a cross-sectional view of the semiconductor device.

Figure 14:
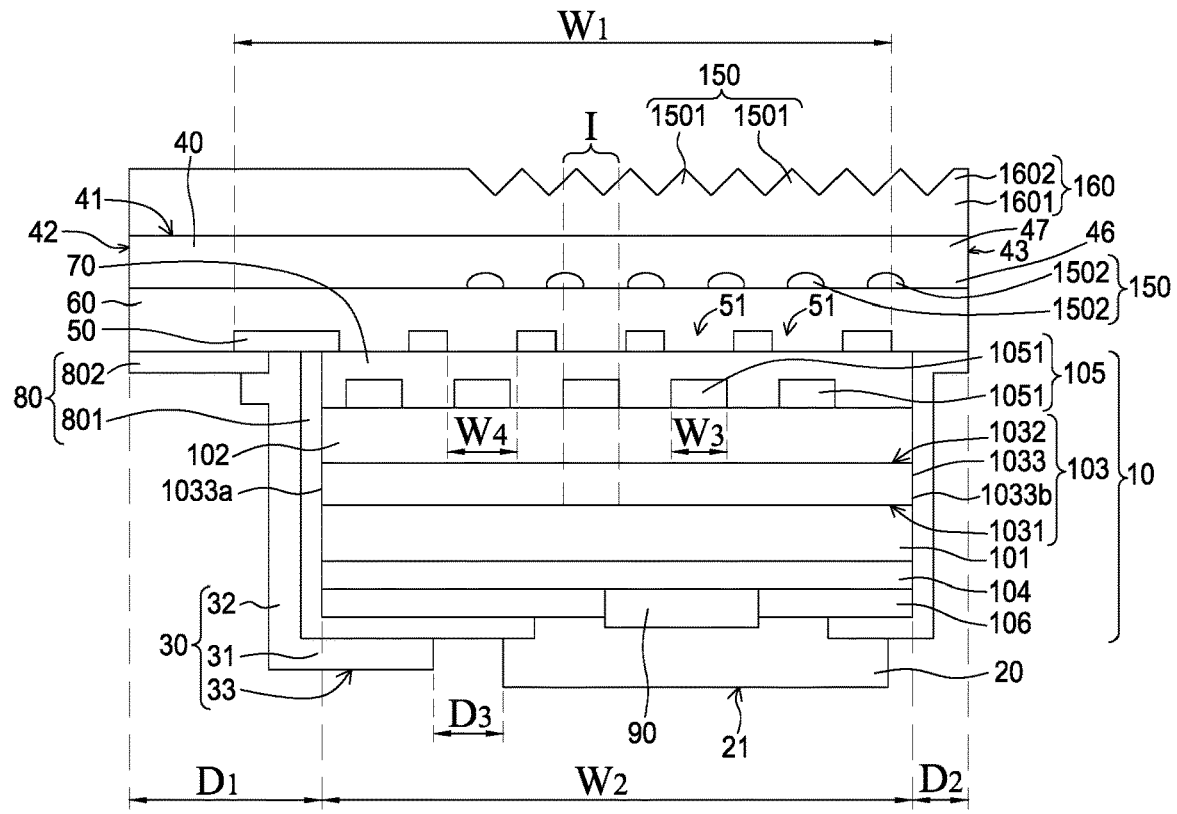
FIG. 14 is a schematic cross-sectional view of a sixteenth embodiment of the semiconductor device.

FIG. 14 is a schematic cross-sectional view of a sixteenth embodiment of the semiconductor device. The semiconductor device in accordance with the sixteen embodiment of the present disclosure includes substantially the same structure as the fourteenth embodiment, and the difference is described below. The semiconductor device further includes an optical structure 160 attached to the second side 47 of the substrate 40. In the present embodiment, the second side 47 of the substrate 40 includes the top surface 41 opposite to the semiconductor stack 10. The optical structure 160 is on the top surface 41 of the second side 47 of the substrate 40. The optical structure 160 includes a third side 160, a fourth side 1602, and an optical element 150 as described in the previous embodiments. The third side 1601 is closer to the substrate 40 than the fourth side 1602 is to the substrate 40. The optical element 150 of the optical structure 160 is formed at the fourth side 1602. In the present embodiment, the optical structure 160 includes a material different from that of the substrate 40. Preferably, the optical structure 160 includes a material substantially transparent to the radiation emitted by the cavity region 103. In one embodiment, the optical structure 160 includes Si, quartz, $SiO_2$ or $CaF_2$. The radiation escapes to the outside of the semiconductor device from the optical structure 160 through the substrate 40, and the radiation pattern of the radiation can be changed by the optical structure 160 and the optical element 150 of the substrate 40. In another embodiment, the optical structure 160 is between the substrate 40 and the semiconductor stack 10.

Figure 15:
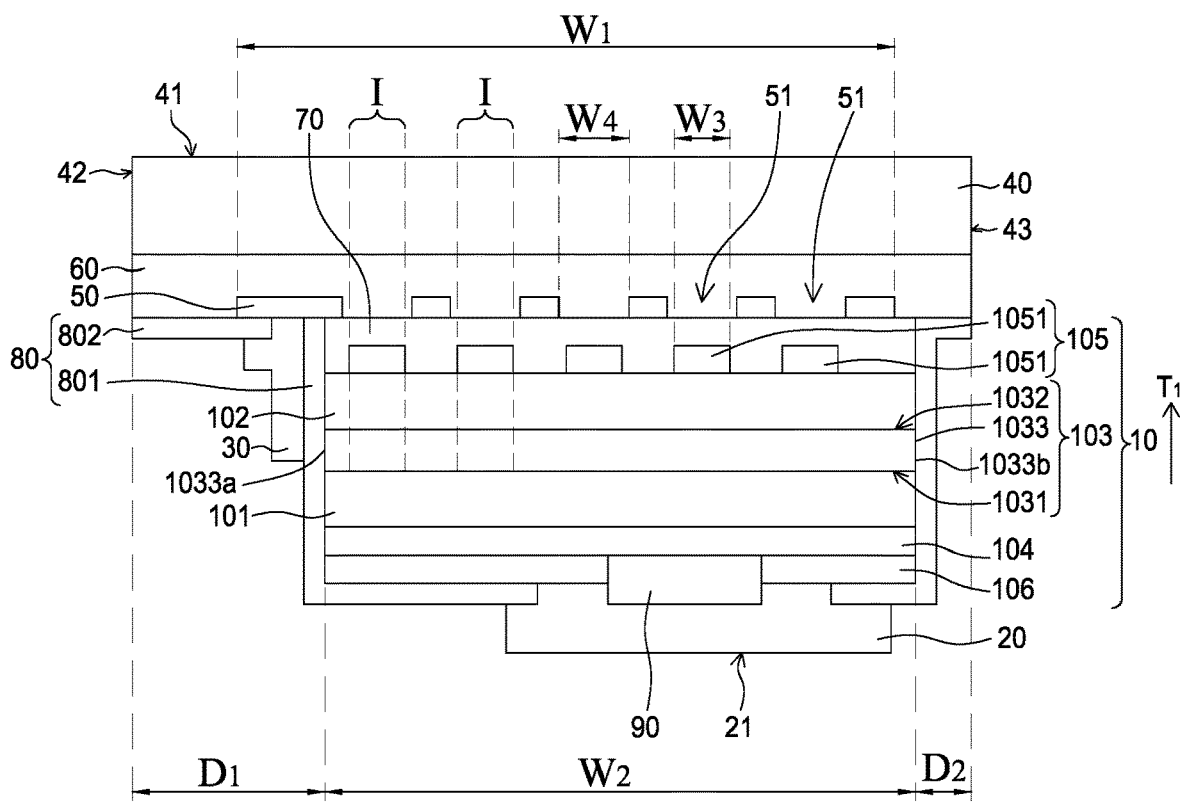
FIG. 15 is a schematic top view of a seventeenth embodiment of the semiconductor device.

FIG. 15 is a schematic top view of a seventeenth embodiment of a semiconductor device. The semiconductor device in accordance with the seventeenth embodiment of the present disclosure includes substantially the same structure as the first embodiment, and the difference is that the second electrode 30 is devoid of the pad portion 31 as described in the first embodiment. In the present embodiment, the first electrode 20 and the second electrode 30 are on the same side of the first conductive layer 50.

The present disclosure further provides a semiconductor package (not shown). The semiconductor package includes the semiconductor device of one of the embodiments from the first embodiment to the sixth embodiment as described above. The semiconductor package further includes an optical structure 160 as described in the sixteenth embodiment. The optical structure 160 is separated from the semiconductor device by a distance of not less than 200 µm. In one embodiment, the semiconductor package further includes a first lens (not shown) between the optical structure 160 and the semiconductor device. In another embodiment, the optical structure 160 is between the first lens and the semiconductor device. In one embodiment, the semiconductor package further includes a second lens (not shown). The first lens and the second lens sandwich the optical structure 160, and the first lens or the second lens is between the optical structure 160 and the semiconductor device.

In accordance with a further embodiment of the present disclosure, the structures in the embodiments of the present disclosure can be combined or changed. For example, the semiconductor device as shown in FIG. 7 includes the mesa structure 1021 as shown in FIG. 10.

In accordance with a further embodiment of the present disclosure, the bonding layer 60 includes transparent conducive oxide, metal, insulating oxide, or polymer. The transparent conducive oxide includes indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). The metal includes In, Sn, Au, Pt, W, Ti, Al, Ni or the alloys thereof. The insulating oxide includes aluminum oxide ($AlO_x$), silicon oxide ($SiO_x$), or silicon oxynitride ($SiO_xN_y$). The polymer includes epoxy, polyimide, perfluorocyclobutane, benzocyclobutene (BCB) or silicone. In one embodiment, if the bonding layer 60 includes metal, the thickness of the bonding layer 60 is thin enough to be transparent to the radiation emitted from the cavity region 103. In one embodiment, if the bonding layer 60 includes transparent conducive oxide, the bonding layer 60 has a thickness between 400 nm and 5000 nm.

In accordance with a further embodiment of the present disclosure, the second conductive layer 70 has an optical thickness substantially equal to $N\lambda/4$, wherein $\lambda$ is the peak wavelength of the radiation emitted from cavity region 103, and N is an odd positive integer. In one embodiment, the second conductive layer 70 includes transparent conductive oxide, such as indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). In one embodiment, the second conductive layer 70 includes graphene. The second conductive layer 70 is substantially transparent to the radiation emitted by the cavity region 103.

In accordance with a further embodiment of the present disclosure, the substrate 40 has a thickness thick enough for supporting the layers or structures thereon, for example, not less than 50 µm, and preferably, not more than 250 µm, and more preferably, not more than 200 µm. In one embodiment, the substrate 40 has a thickness between 80 µm and 120 µm. In one embodiment, the substrate 40 includes a conductive material including Si. In another embodiment, the substrate 40 is transparent to the radiation emitted from the cavity region 103. In one embodiment, the substrate 40 includes sapphire or AlN.

In the present embodiment, the growth substrate 100 provides a top surface for epitaxially growing the semiconductor stack 10. The growth substrate 100 has a thickness thick enough for supporting the layers or the structures grown thereon. Preferably, the growth substrate 100 has a thickness not less than 100 µm, and preferably, not greater than 250 µm. The growth substrate 100 is single crystal and includes a semiconductor material, for example, a Group III-V semiconductor material or a Group IV semiconductor material. In one embodiment, the growth substrate 100 includes a Group III-V semiconductor material of n-type or p-type. In the present embodiment, the Group III-V semiconductor material includes GaAs of n-type. The n-type dopant includes Si.

In accordance with a further embodiment of the present disclosure, the MQW structure includes alternating barrier layers and well layers. The band gap of each barrier layer is higher than the band gap of one of the well layers. The peak wavelength of the radiation emitted from the cavity region 103 can be changed by adjusting the thicknesses and the material of the well layers. Preferably, the material of the well layers includes a Group III-V semiconductor material, such as AlGaAs. The material of the barrier layers includes a Group III-V semiconductor material, such as AlGaAs. The cavity region 103 may further include a space layer between the MQW structure and the first reflective structure 101 and/or between the MQW structure and the second reflective structure 102 for adjusting the total thickness of the cavity region 103 to substantially satisfy an optical thickness equal to $N'\lambda/2$, wherein $\lambda$ is the peak wavelength of the radiation emitted from the cavity region 103, and N' is an positive integer. In the present embodiment, the material of the space layer includes a Group III-V semiconductor material, such as AlGaAs.

In accordance with a further embodiment of the present disclosure, the second semiconductor contact layer 105 is of p-type. The second semiconductor contact layer 105 includes a dopant having a doping concentration not less than $10^{18}/cm^3$, and preferably, not less than $10^{19}/cm^3$, and more preferably, between $1\times10^{19}/cm^3$ and $5\times10^{22}/cm^3$ both inclusive. The material of the second semiconductor contact layer 105 includes a Group III-V semiconductor material, such as GaAs, AlGaAs. The p-type dopant includes Mg, C or Zn.

In accordance with a further embodiment of the present disclosure, the first semiconductor contact layer 104 is of n-type. The first semiconductor contact layer 104 includes a dopant having a doping concentration greater than $10^{18}/cm^3$, and preferably, not less than $10^{19}/cm^3$, and more preferably, between $1\times10^{19}/cm^3$ and $5\times10^{22}/cm^3$ both inclusive. The material of the second semiconductor contact layer 105 includes a Group III-V semiconductor material, such as GaAs, AlGaAs. The n-type dopant includes Si or Te.

In accordance with a further embodiment of the present disclosure, the first insulating layer 80 and the second insulating layer 130 includes insulating material including aluminum oxide ($AlO_x$), silicon oxide ($SiO_x$), silicon oxynitride ($SiO_xN_y$), silicon nitride ($Si_xN_y$), epoxy, polyimide, perfluorocyclobutane, benzocyclobutene (BCB) or silicone. In one embodiment, the material of the first insulating layer 80 may be the same as the material of the second insulating layer 130. In one embodiment, the material of the first insulating layer 80 may be the different from the material of the second insulating layer 130.

In accordance with a further embodiment of the present disclosure, the etching stop layer 106 includes Group III-V semiconductor material. In one embodiment, the etching stop layer 106 can be removed by an etchant. The etchant has a first etching rate to the material of the etching stop layer 106. The etchant has a second etching rate to the material of the first semiconductor contact layer 104. The second etching rate is different from the first etching rate. Preferably, the second etching rate is greater than the first etching rate. For example, when the first semiconductor contact layer 104 includes GaAs, the etching stop layer 106 includes InGaP. The etching stop layer 106 includes a dopant having a doping concentration lower than that of the first semiconductor contact layer 104. Specifically, the doping concentration of the first semiconductor contact layer 104 is at least two times greater than the doping concentration of the etching stop layer 106.

In accordance with a further embodiment of the present disclosure, the first electrode 20 and the second electrode 30 are for electrically connecting to an external power source and for conducting a current therebetween. The material of the first electrode 20, the first conductive layer 50, and the second electrode 30 includes transparent conductive oxide or metal. The transparent conductive oxide includes indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal includes In, Sn, Au, Pt, W, Ti, Al, Ni or the alloys thereof. Preferably, the first conductive layer 50 includes metal.

In accordance with a further embodiment of the present disclosure, the first width $W_1$, the second width $W_2$, the third width $W_3$, the fourth width $W_4$, the first distance $D_1$, the second distance $D_2$, the third distance $D_3$, the maximum width of the metal contact layer 90, the maximum width of the first electrode 20, and the width of each of the conductive regions 107 are determined in a direction substantially perpendicular to the thickness direction (T1) of the cavity region 103. The height of each of the protrusions 1501 of the optical element 150 is determined in a direction substantially parallel to the thickness direction (T1) of the cavity region 103.

In accordance with a further embodiment of the present disclosure, the radiation includes light. In one embodiment, the light may be visible light. Preferably, the light has a peak wavelength between about 580 nm and 730 nm. In another embodiment, the light may be invisible light. Preferably, the light has a peak wavelength between about 730 nm and 1600 nm, and more preferably, between about 800 nm and 1000 nm.

In one embodiment, the current confinement layer 140 is separated from the cavity region 103 by a pair of a first semiconductor layer and an adjacent second semiconductor layer. In another embodiment, the current confinement layer 140 is separated from the cavity region 103 by two pairs of first semiconductor layers and second semiconductor layers. In another embodiment, the current confinement layer 140 is in direct contact with the cavity region 103.

In one embodiment, the cavity region 103 further includes a first conductivity-type cladding layer and a second conductivity-type cladding layer. The first conductivity-type cladding layer and the second conductivity-type cladding layer sandwich the active region. Each of the first conductivity-type cladding layer and the second conductivity-type cladding layer has an energy gap higher than the energy gap of any one of the barrier layers. Specifically, each of the first conductivity-type cladding layer and the second conductivity-type cladding layer has an energy gap less than the energy gap of the conductive area 1401 of each of the current confinement layers 140.

In the present disclosure, the semiconductor device of the embodiments can be flip-chip mounted on another support member including circuits, and most of the radiation escapes to the outside of the semiconductor device from the substrate 40.

The semiconductor device is applicable to sensors such as proximity, 3D-sensing, night vision systems, oximeter or data communication.

The method of performing epitaxial growth includes, but is not limited to metal-organic chemical vapor deposition (MOCVD), hydride vapor phase epitaxy (HVPE), molecular beam epitaxy (MBE), or liquid-phase epitaxy (LPE).

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
   a first semiconductor contact layer having a top side and a back side opposite the top side;
   plural columnar semiconductor stack structures over the top side of the first semiconductor contact layer, and each of the columnar semiconductor stack structures includes:
      a first reflective structure;
      a cavity region;
      a second reflective structure;
      a current confinement layer in the second reflective structure and having a conductive area and an insulating area surrounding the conductive area; and
      a second semiconductor contact layer;
   an insulating layer covering the columnar semiconductor stack structures and having openings formed through the insulating layer, wherein each of the openings is directly on the columnar semiconductor stack structures and at least one of the openings corresponds to at least one of the insulating areas, wherein a width of the opening is equal to or smaller than a width of the insulating area;
   a first electrode disposed over at least portion of the back side of the first semiconductor contact layer; and
   a second electrode disposed over at least portion of the first semiconductor contact layer.

2. The semiconductor device according to claim 1, wherein, in a top view, the second electrode is located at a peripheral of the semiconductor device.

3. The semiconductor device according to claim 1, wherein the insulating layer surrounds the current confinement layers of the columnar semiconductor stack structures.

4. The semiconductor device according to claim 1, wherein a width of the first semiconductor contact layer is wider than a width of the first electrode.

5. The semiconductor device according to claim 1, wherein, in a top view, the plural columnar semiconductor stack structures are substantially arranged periodically.

6. The semiconductor device according to claim 1, further comprising plural trenches over the top side of the first semiconductor contact layer,
   wherein the plural columnar semiconductor stack structures are separated from each other by the plural trenches.

7. The semiconductor device according to claim 6, wherein, in a top view, the plural trenches are connected.

8. The semiconductor device according to claim 1, wherein the second electrode further extends to a sidewall of at least one of the columnar semiconductor stack structures.

9. The semiconductor device according to claim 8, wherein the second electrode includes:
   a pad portion; and
   a side portion extending from the pad portion and covering the sidewall of the columnar semiconductor stack structure,
   wherein a width of the pad portion is wider than a width of the side portion.

10. The semiconductor device according to claim 1, further comprising a substrate bonded to the columnar semiconductor stack structures.

11. The semiconductor device according to claim 10, further comprising a bonding layer between the substrate and the columnar semiconductor stack structures.

12. The semiconductor device according to claim 10, wherein the substrate has protrusions thereon.

* * * * *